(12) United States Patent
Ota et al.

(10) Patent No.: US 10,470,298 B2
(45) Date of Patent: Nov. 5, 2019

(54) CIRCUIT BOARD INCLUDING DUMMY ELECTRODE FORMED ON SUBSTRATE

(71) Applicant: BROTHER KOGYO KABUSHIKI KAISHA, Nagoya, Aichi (JP)

(72) Inventors: Shoko Ota, Okazaki (JP); Nobumasa Tanaka, Nagoya (JP); Ryuji Horata, Gamagori (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 15/938,123

(22) Filed: Mar. 28, 2018

(65) Prior Publication Data
US 2018/0288869 A1 Oct. 4, 2018

(30) Foreign Application Priority Data

Mar. 31, 2017 (JP) .................. 2017-073003

(51) Int. Cl.
*B41J 2/175* (2006.01)
*H05K 1/02* (2006.01)
(Continued)

(52) U.S. Cl.
CPC .......... *H05K 1/0259* (2013.01); *B41J 2/1753* (2013.01); *B41J 2/17523* (2013.01);
(Continued)

(58) Field of Classification Search
CPC ...... H05K 1/0259; H05K 1/112; H05K 1/181; H05K 2201/10204; B41J 2/1753; B41J 2/17546; B41J 2/17523; B41J 2/17553
See application file for complete search history.

(56) References Cited

U.S. PATENT DOCUMENTS

| 6,074,041 A | 6/2000 | Imanaka et al. |
| 2002/0024559 A1 | 2/2002 | Murray et al. |

(Continued)

FOREIGN PATENT DOCUMENTS

| EP | 1 800 872 A1 | 6/2007 |
| EP | 1 829 691 A1 | 9/2007 |

(Continued)

OTHER PUBLICATIONS

International Search Report and Written Opinion dated Jun. 18, 2018 from related PCT/JP2018/012642.

*Primary Examiner* — Yaovi M Ameh
(74) *Attorney, Agent, or Firm* — Scully, Scott, Murphy & Presser, P.C.

(57) ABSTRACT

A circuit board to be mounted on a casing of a cartridge includes an insulating substrate, an integrated circuit mounted on the substrate, terminals and a dummy electrode. The terminals are electrically connected to the integrated circuit, while the dummy electrode is electrically disconnected from the integrated circuit. The terminals and dummy electrode are formed on the substrate to satisfy an inequity of L1+L2<L3, where L1 is a shortest distance among distances between edges of the terminals and an edge of the dummy electrode in a direction perpendicular to a predetermined direction in which the terminals are aligned with one another; L2 is a shortest distance between an edge of the dummy electrode and an edge of the casing in the predetermined direction; and L3 is a shortest distance among distances between edges of the terminals and the edge of the casing in the predetermined direction.

17 Claims, 14 Drawing Sheets

(51) Int. Cl.
*H05K 1/11* (2006.01)
*H05K 1/18* (2006.01)

(52) U.S. Cl.
CPC ....... *B41J 2/17546* (2013.01); *B41J 2/17553* (2013.01); *H05K 1/112* (2013.01); *H05K 1/181* (2013.01); *H05K 2201/10204* (2013.01)

(56) References Cited

U.S. PATENT DOCUMENTS

| | | | |
|---|---|---|---|
| 2003/0051904 A1 | 3/2003 | Aruga | |
| 2012/0056920 A1* | 3/2012 | Asauchi | B41J 2/17513 347/1 |
| 2016/0128175 A1* | 5/2016 | Kobayashi | B41J 2/14072 347/50 |
| 2017/0066249 A1 | 3/2017 | Ono et al. | |

FOREIGN PATENT DOCUMENTS

| | | | |
|---|---|---|---|
| EP | 2 607 090 A2 | 6/2013 |
| GB | 2499325 A | 8/2013 |
| JP | H07-148916 A | 6/1995 |
| JP | 2003-152297 A | 5/2003 |
| WO | 2013/014806 A1 | 1/2013 |

\* cited by examiner

CIRCUIT BOARD INCLUDING DUMMY ELECTRODE FORMED ON SUBSTRATE

CROSS REFERENCE TO RELATED APPLICATION

This application claims priority from Japanese Patent Application No. 2017-073003 filed Mar. 31, 2017. The entire content of the priority application is incorporated herein by reference.

TECHNICAL FIELD

The present disclosure relates to a circuit board, a liquid cartridge, and a storage device.

BACKGROUND

There is conventionally known an image-recording apparatus configured to record images onto recording sheets using ink. Such conventional image-recording apparatus includes an ink cartridge detachably attachable to a cartridge-attachment section, and a recording head configured to selectively eject ink supplied from the ink cartridge onto the recording sheets. In the image-recording apparatus, a desired image can be recorded onto each recording sheet by having the ink ejected from nozzles adhered to the recording sheet.

Some ink cartridges may include circuit boards for storing information concerning color of ink, residual amount of ink, and maintenance state, for example. As an example, Japanese Patent Application Publication No. 2003-152297 discloses an ink cartridge provided with a circuit board on which disposed are a terminal for inputting and outputting the above information, and a memory module for storing the information inputted and outputted through the terminal. When this ink cartridge is attached to a cartridge-attachment section of an image-recording apparatus, the terminal formed on the circuit board is electrically connected to a connector provided in the cartridge-attachment section; and the memory module stores information inputted and outputted through the terminal that is connected to the connector of the cartridge-attachment section.

SUMMARY

Electrodes formed on a circuit board are exposed to the outside. Hence, when a user's hand touches or approaches the electrodes, electrostatic discharge may occur between the electrodes and the user's hand so that discharge current may flow into an internal circuit of the circuit board through the electrodes. Conceivably, such current inflow into the internal circuit attributed to the electrostatic discharge may cause damage to some of those elements constituting the internal circuit.

In view of the foregoing, it is an object of the present disclosure to provide a circuit board, a liquid cartridge, and a storage device capable of reducing a likelihood that an internal circuit may be damaged by discharge current caused by electrostatic discharge.

(1) In order to attain the above and other objects, according to an aspect, the present disclosure provides a circuit board to be mounted on a casing of a cartridge. The circuit board includes an insulating substrate, a plurality of terminals, an integrated circuit, and a dummy electrode. The plurality of terminals is formed on the substrate and is exposed to an outside of the casing. The plurality of terminals is aligned with one another in a predetermined direction. The integrated circuit is mounted on the substrate and is electrically connected to the plurality of terminals. The dummy electrode is formed on the substrate and is electrically disconnected from the integrated circuit. In this circuit board, an inequity of $L1+L2<L3$ is met, where: $L1$ is a shortest distance among distances between edges of the plurality of terminals and an edge of the dummy electrode in a direction perpendicular to the predetermined direction; $L2$ is a shortest distance between an edge of the dummy electrode and an edge of the casing in the predetermined direction; and $L3$ is a shortest distance among distances between edges of the plurality of terminals and the edge of the casing in the predetermined direction.

Here, the distance $L3$ may also be defined as follows. Suppose that: one of the plurality of terminals that is arranged closest to the edge of the casing in the predetermined direction is defined as a particular terminal; and the particular terminal has a first edge and a second edge opposite to each other in the predetermined direction, the first edge being closer to the edge of the casing than the second edge is to the casing in the predetermined direction. Here, $L3$ can be defined as a distance between the first edge of the particular terminal and the edge of the casing in the predetermined direction.

(2) According to another aspect, the present disclosure may be embodied as a liquid cartridge including the circuit board of the aspect (1) and the casing on which the circuit board is mounted. The casing defines a liquid storage chamber therein for storing liquid; and the casing includes a liquid outlet port configured to supply the liquid stored in the liquid storage chamber to an outside of the casing.

(3) According to still another aspect, the present disclosure may be embodied as a storage device including a circuit board and a case defining an accommodating space therein for accommodating the circuit board. In this storage device, the circuit board includes: an insulating substrate; a plurality of terminals formed on the substrate, the plurality of terminals being aligned with one another in a predetermined direction; an integrated circuit mounted on the substrate and electrically connected to the plurality of terminals; and a dummy electrode formed on the substrate and electrically disconnected from the integrated circuit. The case is formed with at least one opening through which the plurality of terminals of the circuit board is exposed to an outside of the case. In this storage device, an inequity of $L1+L2<L3$ is met, where: $L1$ is a shortest distance among distances between edges of the plurality of terminals and an edge of the dummy electrode in a direction perpendicular to the predetermined direction; $L2$ is a shortest distance between an edge of the dummy electrode and an edge of the case in the predetermined direction; and $L3$ is a shortest distance among distances between edges of the plurality of terminals and the edge of the case in the predetermined direction.

BRIEF DESCRIPTION OF THE DRAWINGS

The particular features and advantages of the disclosure as well as other objects will become apparent from the following description taken in connection with the accompanying drawings, in which.

DETAILED DESCRIPTION

Hereinafter, embodiments of the present disclosure will be described while referring to accompanying drawings.

First Embodiment

Figure 2:
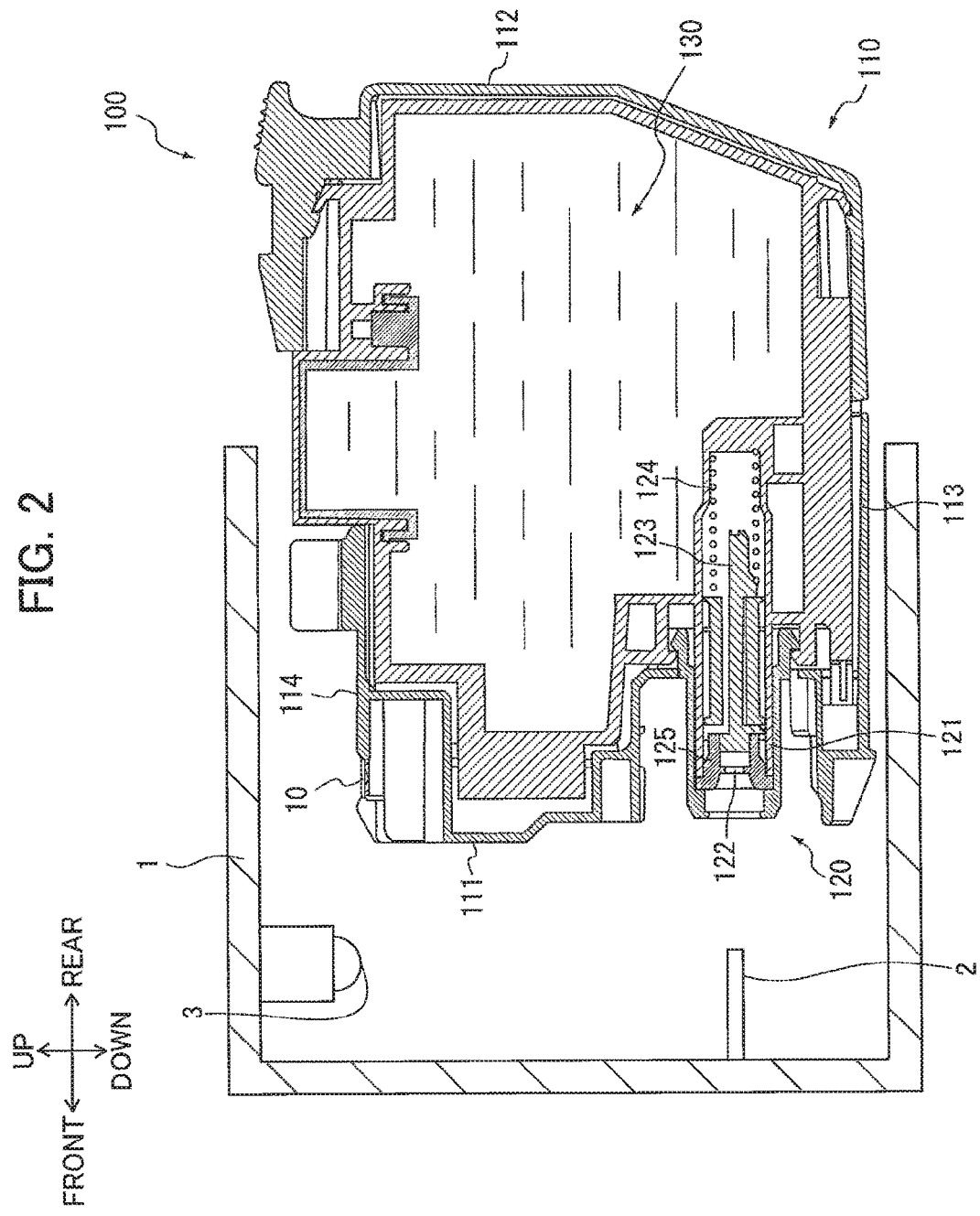
FIG. 2 is a vertical cross-sectional view of the ink cartridge according to the first embodiment and a cartridge holder of a printer.

In a first embodiment, the present disclosure is applied to an ink cartridge 100 that can be used in an ink-jet printer (not illustrated). The ink cartridge 100 is a container that stores ink of a color used in the printer (not illustrated). The ink cartridge 100 is attachable to a cartridge holder 1 of the printer, as depicted in FIG. 2.

The ink cartridge 100 according to the first embodiment includes a casing 110 and an IC board 10 mounted on the casing 110.

Figure 1:
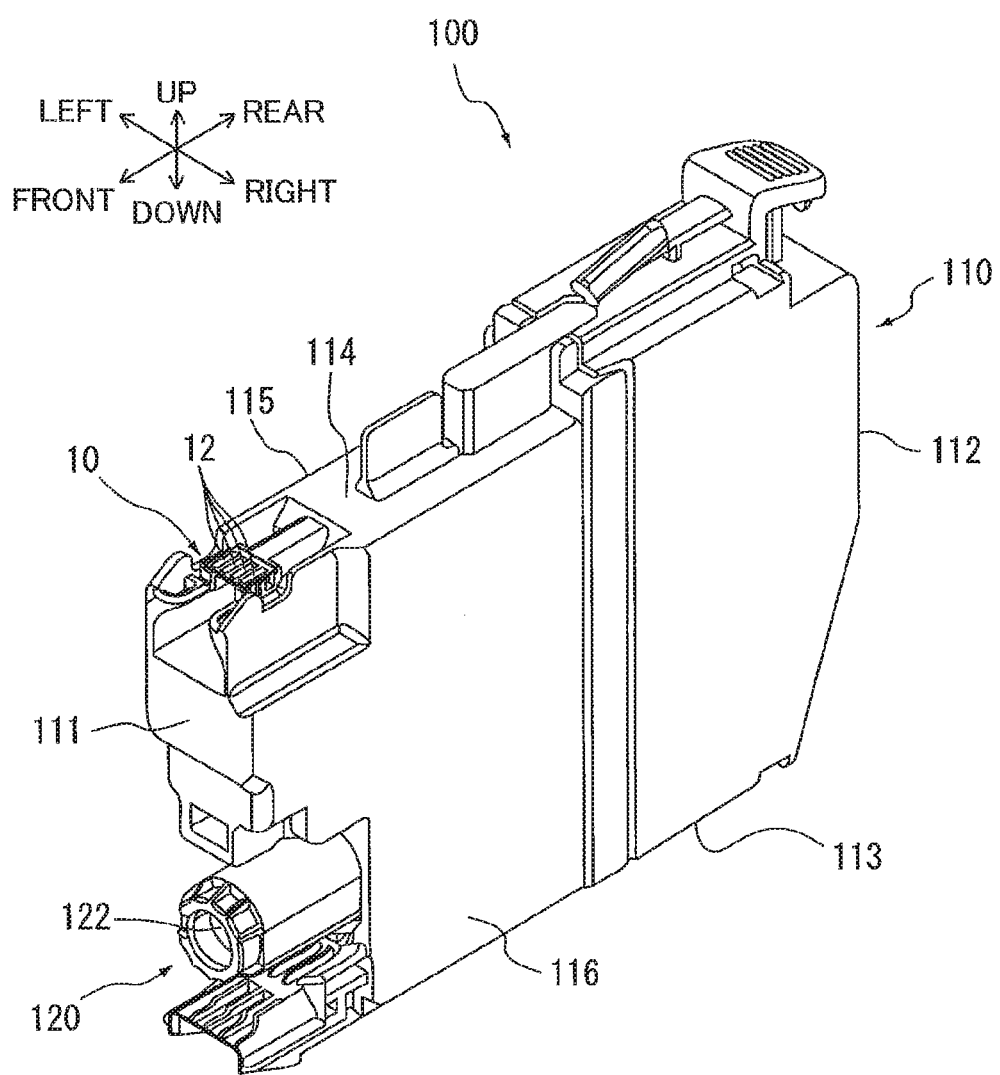
FIG. 1 is a perspective view of an ink cartridge according to a first embodiment of the present disclosure.

The ink cartridge 100 is inserted into the cartridge holder 1 in a posture depicted in FIG. 1. This posture depicted in FIG. 1 will be therefore referred to as attached posture, hereinafter. In the following description, directions in relation to the ink cartridge 100 will reference the state of the ink cartridge 100 depicted in FIG. 1. That is, in the following description, the ink cartridge 100 is assumed to be in its attached posture and the terms "above", "below", "right", "left", "front" and "rear" in relation to the ink cartridge 100 will be referred to based on the directions defined in FIG. 1.

As depicted in FIG. 1, the casing 110 has an overall flattened shape in which its left-right dimension is narrow and its vertical and front-rear dimensions are greater than the left-right dimension. In the attached posture of the ink cartridge 100, a direction from a rear surface 112 of the casing 110 toward a front surface 111 thereof (frontward direction) corresponds to an insertion direction of the ink cartridge 100 to the cartridge holder 1; and a direction from the front surface 111 toward the rear surface 112 (rearward direction) corresponds to a removal direction of the ink cartridge 100 from the cartridge holder 1. The frontward direction and rearward direction will be collectively referred to as front-rear direction, hereinafter, whenever appropriate.

Further, in the attachment posture of the ink cartridge 100, a direction from a lower surface 113 toward an upper surface 114 (upward direction) and a direction from the upper surface 114 toward the lower surface 113 (downward direction) correspond to a vertical direction of the printer and will be collectively referred to as up-down direction or vertical direction, whenever appropriate. In the first embodiment, the gravitational direction coincides with the downward direction (vertically downward) and the insertion direction is orthogonal to the gravitational direction. Further, in the attachment posture of the ink cartridge 100, a direction from a left side surface 115 toward a right side surface 116 (rightward direction) and a direction from the right side surface 116 toward the left side surface 115 (leftward direction) correspond to a left-right direction of the printer and will be collectively referred to as left-right direction, whenever appropriate.

Note that, in the present embodiment, while the front surface 111, rear surface 112, lower surface 113, upper surface 114, left side surface 115, and right side surface 116 of the casing 110 are defined for the shake of convenience, each of the above surfaces need not necessarily be configured as a single plane, and each may have an appropriate structure.

Further, in the following description, description will be made assuming that the right side surface 116 has the largest surface area among the surfaces constituting an outer surface of the casing 110, although the right side surface 116 and left side surface 115 have the same surface area as each other. Further, the front surface 111, rear surface 112, lower surface 113, and upper surface 114 are assumed to be orthogonal to the right side surface 116.

Referring to FIG. 2, the casing 110 includes an ink chamber 130 for storing ink, and an ink-supply portion 120 configured to supply the ink stored in the ink chamber 130 to an outside of the casing 110 (i.e., to the printer). The ink chamber 130 is a space formed inside the casing 110 and is defined by an internal frame.

In the present embodiment, the casing 110 includes: the internal frame defining the ink chamber 130; a cover covering the internal frame and having the front surface 111, rear surface 112, lower surface 113, upper surface 114, left side surface 115, and right side surface 116; and the ink-supply portion 120. However, the casing 110 may not include the cover, but may be configured of a simple housing that defines therein the ink chamber 130 and that has the front surface 111, rear surface 112, lower surface 113, upper surface 114, left side surface 115, and right side surface 116.

The ink-supply portion 120 is provided at a lower portion of the front surface 111 of the casing 110. The ink-supply portion 120 includes a tubular-shaped cylindrical wall 121 protruding in the insertion direction relative to the front surface 111. The cylindrical wall 121 has a rear end (leading end in the removal direction) in communication with the ink chamber 130, and a front end (leading end in the insertion direction) that is opened to the outside of the casing 110. That is, the cylindrical wall 121 provides communication between the ink chamber 130 and the exterior of the ink cartridge 100 through an internal space in the cylindrical wall 121.

The ink-supply portion 120 also includes a valve 123, a coil spring 124, and a seal member 125.

The valve 123 and coil spring 124 are disposed within the internal space of the cylindrical wall 121. The valve 123 and coil spring 124 function to selectively open and close an ink-supply port 122 formed in a center of the seal member 125. The valve 123 is movable in the front-rear direction to open and close the ink-supply port 122 penetrating the center of the seal member 125. The coil spring 124 urges the valve 123 in the front direction while no external force is applied to the valve 123, thereby closing the ink-supply port 122. The valve 123 is configured to selectively switch a status of the ink-supply portion 120, in cooperation with the coil spring 124, between an open state where ink in the ink chamber 130 is allowed to flow to the outside of the ink cartridge 100 through the internal space of the cylindrical wall 121 and a closed state where the ink is prevented from flowing out to the outside of the ink cartridge 100 through the internal space of the cylindrical wall 121.

The seal member 125 is fitted in the open front end of the cylindrical wall 121. The seal member 125 is formed of an elastic member such as rubber or elastomer. The seal member 125 is a disk-shaped member having a through-hole penetrating the center of the seal member 125. This through-hole formed in the center of the seal member 125 serves as the ink-supply port 122. That is, the ink-supply port 122 is defined by a cylindrical-shaped inner peripheral surface constituting the through-hole of the seal member 125. The ink-supply port 122 has an inner diameter that is slightly smaller than an outer diameter of an ink needle 2 provided in the cartridge holder 1 (see FIG. 2). A cap (shown without a reference numeral in FIG. 2) is fitted onto an outer peripheral surface of the cylindrical wall 121 from its front side to allow the seal member 125 to make close contact with the front end of the cylindrical wall 121, thereby providing a liquid-tight seal between the seal member 125 and the front end of the cylindrical wall 121.

During insertion of the ink cartridge 100 into the cartridge holder 1, the ink needle 2 provided in the cartridge holder 1 is inserted into the ink-supply port 122 of the ink-supply portion 120, thereby causing the valve 123 to open the ink-supply port 122 in the ink-supply portion 120. The ink needle 2 and the ink-supply portion 120 are thus allowed to communicate with each other. The ink stored in the ink chamber 130 can be supplied to the printer through the internal space of the cylindrical wall 121 belonging to the ink-supply portion 120 and an internal space of the ink needle 2 belonging to the cartridge holder 1.

The IC board 10 is disposed on the upper surface 114 of the casing 110 at a position above the ink-supply portion 120. The IC board 10 is bonded to the upper surface 114 by a photo-curable adhesive, for example.

Note that the upper surface 114 is a surface orthogonal to (i.e., crossing) the right side surface 116 whose surface area is the largest among all the surfaces constituting the cartridge body 110.

Figure 3:
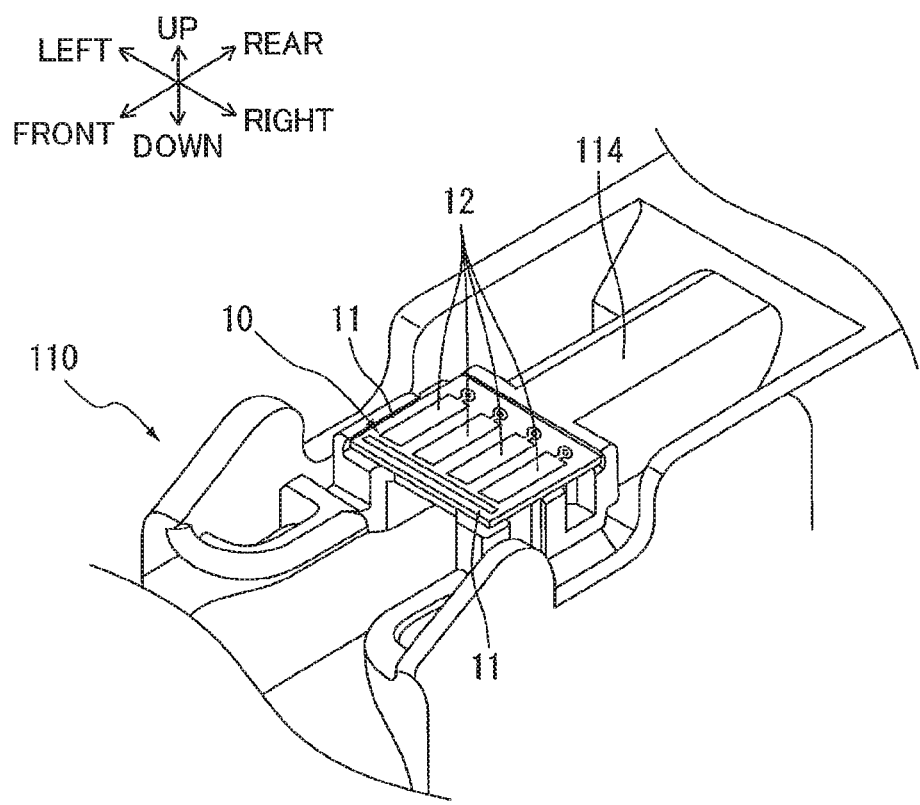
FIG. 3 is a partially enlarged view of the ink cartridge according to the first embodiment, illustrating a portion of a casing on which an IC board is disposed.
Figure 4:
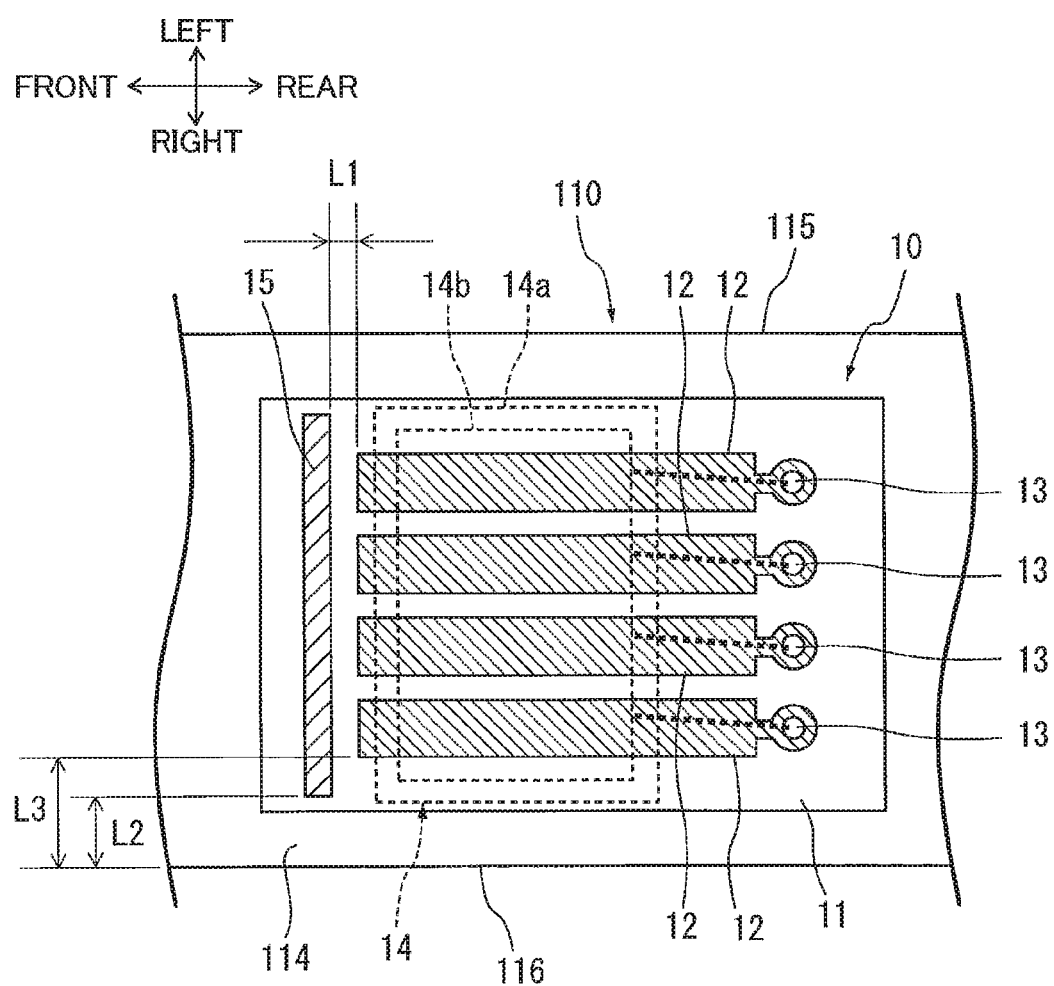
FIG. 4 is a schematic plan view explaining a structure of the IC board mounted on the ink cartridge according to the first embodiment.

Referring to FIGS. 3 and 4, the IC board 10 of the first embodiment includes a printed circuit board 11, four terminals 12, and a chip 14. The printed circuit board 11 is a rectangular-shaped circuit board formed of an electrically insulating material such as glass epoxy resin. The printed circuit board 11 has an upper surface facing upward and serving as an outer surface exposed to the outside, a lower surface opposite the upper surface and facing downward, a front end face facing frontward, a rear end face facing rearward, and left and right side surfaces facing leftward and rightward, respectively. The printed circuit board 11 has a width in the left-right direction that is slightly smaller than a width of the casing 110 in the left-right direction. The printed circuit board 11 has a suitable length in the front-rear direction.

The four terminals 12 are formed on the upper surface of the printed circuit board 11. The terminals 12 extend in the front-rear direction of the casing 110. In other words, the terminals 12 are elongated in a direction in which the ink-supply port 122 faces. As an example, each terminal 12 has a length of about 3 mm in the front-rear direction, a width of about 1.1 mm in a widthwise direction crossing the front-rear direction (i.e., in the left-right direction), and a height of about 35 μm from the upper surface of the printed circuit board 11.

The four terminals 12 are formed on the upper surface of the printed circuit board 11 to be aligned with one another in a predetermined direction in which the terminals 12 are aligned with one another. In the present embodiment, the IC board 10 is mounted on the upper surface 114 of the casing 110 such that the predetermined direction in which the terminals 12 are aligned with one another substantially coincides with the left-right direction of the casing 110. Further, left-right positions of the respective terminals 12 are designed so that each of the terminals 12 can be electrically connected to a corresponding electrical contact 3 (see FIG. 2) provided in the printer (cartridge holder 1) when the ink cartridge 100 is attached to the cartridge holder 1. The four terminals 12 may be, for example, an electrode for clocking, an electrode for data, an electrode for power supply, and an electrode for grounding, respectively.

The chip 14 includes a silicone substrate 14a and an integrated circuit 14b mounted on the silicone substrate 14a. The silicone substrate 14a is electrically non-conductive. The chip 14 is arranged on the lower surface of the printed circuit board 11. Four via holes are formed in the printed circuit board 11 to penetrate the same vertically. Each via hole is filled with an electrically conductive material to form a through electrode 13 connected to corresponding one of the terminals 12. Thus, the through electrodes 13 of the respective terminals 12 are connected to the integrated circuit 14b through corresponding wirings denoted by thick dashed lines in FIG. 4.

Note that positions of the through electrodes 13 can be designed as appropriate. In the present embodiment, each through electrode 13 is provided at a rear end of each terminal 12 as illustrated in FIG. 4. Alternatively, each through electrode 13 may be provided at a front end of each terminal 12.

The integrated circuit 14b includes a storage element (not illustrated), such as a DRAM, a SRAM or a flash memory, for example, for storing information that is inputted and outputted through the terminals 12. Specifically, the integrated circuit 14b stores information relating to the ink cartridge 100, such as a manufacturing date and/or a lot number of the ink cartridge 100, a color of ink stored in the ink cartridge 100, and a residual amount of ink detected by an ink residual amount sensor (not illustrated).

The IC board 10 further includes a dummy electrode 15. Specifically, in the first embodiment, the dummy electrode 15 is formed on the upper surface of the printed circuit board 11 at a position forward of the respective terminals 12. As illustrated in FIG. 4, the dummy electrode 15 is elongated in the left-right direction of the casing 110, that is, in the predetermined direction in which the terminals 12 are aligned with one another. Hence, due to the insulating properties of the printed circuit board 11, the dummy electrode 15 is electrically not connected to anything mounted on the printed circuit board 11. Hence, the dummy electrode 15 is not electrically connected to the integrated circuit 14b.

The terminals 12 and the dummy electrode 15 are formed each by applying gold plating to surfaces of a conductor pattern. For example, first of all, a metal film such as chrome (Cr), nickel (Ni), titanium (Ti), or copper (Cu) is formed on the upper surface of the printed circuit board 11. Then, photoresists corresponding to the patterns of the terminals 12 and dummy electrode 15 are formed, followed by etching to remove the metal film on regions other than those regions corresponding to the terminals 12 and dummy electrode 15. As a result, the conductor patterns corresponding to the terminals 12 and dummy electrode 15 are formed on the upper surface of the printed circuit board 11. Subsequently, the photoresists are removed, and gold plating is applied onto the conductor patterns through electroplating. Through these processes, the terminals 12 and the dummy electrode 15 are formed on the upper surface of the printed circuit board 11.

Here, referring to FIG. 4, assume that: L1 represents a shortest distance between the terminals 12 and the dummy electrode 15 in the front-rear direction; L2 represents a shortest distance between the dummy electrode 15 and an edge of the casing 110 in the left-right direction; and L3 represents a shortest distance between the terminals 12 and the edge of the casing 110 in the left-right direction. In the present embodiment, the terminals 12 and the dummy electrode 15 are arranged such that an inequity of L1+L2<L3 is met. Note that, in the present disclosure, a distance between a member A and a member B represents a distance defined between an edge of the member A and an edge of the member B; and a shortest distance between the member A and member B represents a shortest distance among distances defined between the edges of the members A and B.

Note that, in the example of FIG. 4, L1 is defined as a shortest distance among distances between edges of the terminals 12 and an edge of the dummy electrode 15 in the front-rear direction (i.e., a distance between a front edge of the leftmost terminal 12 and a rear edge of the dummy electrode 15 in the front-rear direction); L2 is defined as a shortest distance between an edge of the dummy electrode 15 and the right side surface 116 of the casing 110 in the left-right direction (i.e., a distance between a right edge of the dummy electrode 15 and the right side surface 116 of the casing 110 in the left-right direction); and L3 is defined as a shortest distance among distances between edges of the terminals 12 and the right side surface 116 of the casing 110 in the left-right direction (i.e., a distance between a right edge of the rightmost terminal 12 and the right side surface 116 of the casing 110 in the left-right direction).

Alternatively, L2 may be defined as a shortest distance between the dummy electrode 15 and the left side surface 115 of the casing 110 in the left-right direction (i.e., a distance between a left edge of the dummy electrode 15 and the left side surface 115 of the casing 110 in the left-right direction); and L3 may be defined as a shortest distance among distances between edges of the terminals 12 and the left side surface 115 of the casing 110 in the left-right direction (i.e., a distance between a left edge of the leftmost terminal 12 and the left side surface 115 of the casing 110 in the left-right direction).

Also note that, in a case where the ink cartridge 100 is placed on a reference plane G with the right side surface 116 (having the largest surface area among those surfaces constituting the outer surface of the casing 110) facing vertically downward and in contact with the reference plane G, it is preferable that nothing belonging to the ink cartridge 100 be interposed between the IC board 10 and the reference plane G so that the right edge of the dummy electrode 15 opposes the reference plane G with an air space intervened therebetween. In other words, preferably, the IC board 10 be exposed to the outside so that: the IC board 10 is visible when viewed in the left-right direction; and the terminals 12 and dummy electrode 15 can be accessed from the outside. In the present embodiment, as depicted in FIG. 3, each of the left and right edges of the IC board 10 is exposed to the outside through a recess formed in a corresponding side wall of the casing 110 of the ink cartridge 100. Here, the recess (shown without a reference numeral in FIG. 3) is recessed downward from an upper edge of the corresponding side wall (right side surface 116 or left side surface 115) of the casing 110. Hence, the IC board 10 is visible through the corresponding recess when the ink cartridge 100 is viewed in the left-right direction.

Next, functions of the dummy electrode 15 will be described with reference to FIG. 5.

Figure 5:
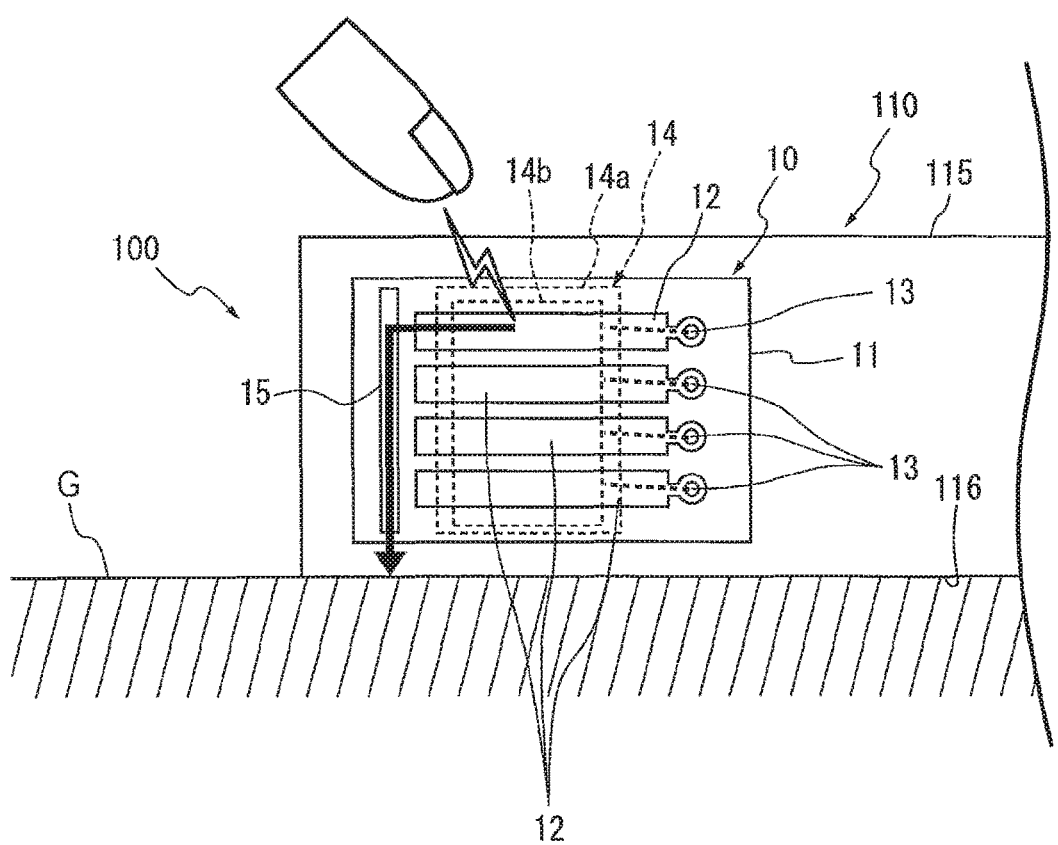
FIG. 5 is a schematic explanatory view explaining how a dummy electrode mounted on the IC board works in the ink cartridge according to the first embodiment.

In FIG. 5, the right side surface 116 (i.e., the surface having the largest surface area among those surfaces constituting the casing 110) is made to contact on the reference plane G with the right side surface 116 facing vertically downward. In this state, the terminals 12 extend in a direction orthogonal to the vertically downward direction (gravitational direction), i.e., in the horizontal direction; and the dummy electrode 15 extends in the vertically downward direction (i.e., the gravitational direction). In the example of FIG. 5, L2 is defined as a shortest distance between the dummy electrode 15 and the reference plane G in the left-right direction (i.e., a distance between the right edge of the dummy electrode 15 and the reference plane G in the left-right direction), and L3 is defined as a shortest distance between the terminals 12 and the reference plane G in the left-right direction (i.e., a distance between the right edge of the rightmost terminal 12 and the reference plane G in the left-right direction). Assume that the reference plane G is an electrically conductive surface and a user's finger may approach the IC board 10 of the ink cartridge 100, electrostatic discharge may occur between the user's finger and one or some of the terminals 12. When there occurs electrostatic discharge to any of the terminals 12, excessively high voltage is applied to the terminal 12 subjected to the electrostatic discharge. As a result, discharge current flows from the subjected terminal 12 into the reference plane G.

Here, in order to better understand the present disclosure, assume a conventional ink cartridge without the dummy electrode 15 as a comparative example. In such conventional ink cartridge, since the dummy electrode 15 is not formed on the printed circuit board 11, discharge current flows into the integrated circuit 14b through one of the terminals 12 and its corresponding through electrode 13, and then into the reference plane G through another one of the through electrodes 13 and its corresponding terminal 12. The discharge current flowing into the integrated circuit 14b may damage some of elements constituting the integrated circuit 14b, possibly disabling reading-out of information from the integrated circuit 14b and writing-in of information in the integrated circuit 14b.

Contrary to such conventional ink cartridge, the ink cartridge 100 of the present embodiment includes the dummy electrode 15 formed on the electrically insulating printed circuit board 11. Further, in the ink cartridge 100 of the present embodiment, the terminals 12 and the dummy electrode 15 are arranged such that the inequity of L1+L2<L3 is met. That is, a path from the subjected terminal 12 to the reference plane G through the dummy electrode 15 (shown by a thick bold arrow in FIG. 5) has an electrically insulating portion whose length (L1+L2) is shorter than a length (L3) of an electrically insulating portion on a path from the subjected terminal 12 to the reference plane G through the integrated circuit 14b and the rightmost terminal 12 (the terminal 12 closest to the reference plane G among the terminals 12). Hence, if an excessive high voltage is applied to any of the terminals 12, dielectric breakdown between the subjected terminal 12 and the reference plane G is highly likely to occur along the path via the dummy electrode 15 rather than along the path via the integrated circuit 14b. That is, the dielectric breakdown between the subjected terminal 12 and the reference plane G along the path via the dummy electrode 15 occurs earlier than along the path via the integrated circuit 14b. As a result, the discharge current is highly likely to flow from the subjected terminal 12 to the dummy electrode 15, and then to the reference plane G, as illustrated in FIG. 5. That is, the discharge current due to the electrostatic discharge is highly likely to flow from the subjected terminal 12 into the reference plane G through the dummy electrode 15 that is electrically disconnected from the integrated circuit 14b. As a result, the integrated circuit 14b is less likely to suffer from damages caused by the discharge current as a result of the electrostatic discharge.

Incidentally, the dummy electrode 15 may be electrically connectable to the electrical contact 3 provided in the printer (cartridge holder 1) when the ink cartridge 100 is attached to the cartridge holder 1 so that information concerning the ink cartridge 100 can be detected at the printer. In this case, the printer may detect that the ink cartridge 100 is attached to the cartridge holder 1 by detecting electrical connection between the dummy electrode 15 and the electrical contact 3 of the printer, for example.

Second Embodiment

Figure 6:
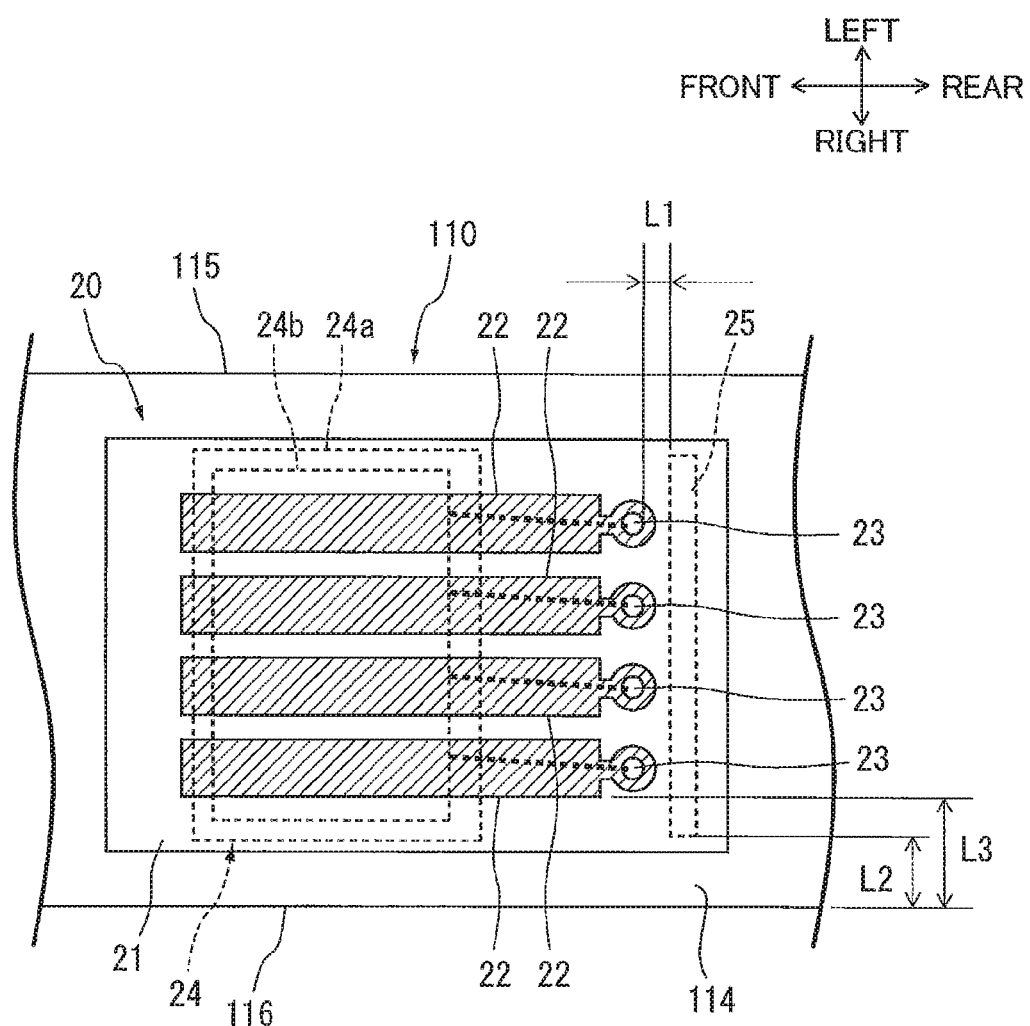
FIG. 6 is a schematic plan view explaining a structure of an IC board mounted on an ink cartridge according to a second embodiment.

An IC board 20 according to a second embodiment of the present disclosure will be described next with reference to FIG. 6. The IC board 20 is arranged on the upper surface 114 of the casing 110, as in the first embodiment.

The IC board 20 includes a printed circuit board 21, four terminals 22, and a chip 24. The terminals 22 are disposed on an upper surface of the printed circuit board 21 to be aligned with one another in the left-right direction of the casing 110. The chip 24 includes a silicone substrate 24a and an integrated circuit 24b mounted on the silicone substrate 24a. The chip 24 is disposed on a lower surface of the printed circuit board 21.

The IC board 20 also includes a dummy electrode 25 that is not connected to the integrated circuit 24b. The dummy electrode 25 according to the second embodiment is formed on the lower surface of the printed circuit board 21 at a portion rearward of the arrayed terminals 22. As illustrated in FIG. 6, the dummy electrode 25 is elongated in the left-right direction of the casing 110, i.e., in a direction in which the terminals 22 are aligned with one another.

Four via holes are formed in the printed circuit board 21 to penetrate the same vertically each at the rear end of the corresponding terminal 22. Each via hole is filled with an electrically conductive material to form a through electrode 23. The through electrode 23 of each terminal 22 and the integrated circuit 24b are connected to each other through a wiring denoted by a thick dashed line in FIG. 6.

In the second embodiment, the dummy electrode 25 is disposed on the lower surface of the printed circuit board 21 such that a shortest distance between the through electrodes 23 and the dummy electrode 25 is defined as L1. Also in the second embodiment, the terminals 22 and the dummy electrode 25 are arranged such that the inequity of L1+L2<L3 is met, where L1 is the shortest distance among distances between the terminals 22 (more specifically, the through electrodes 23 of the respective terminals 22) and the dummy electrode 25 (i.e., a distance between a rear edge of the leftmost through electrode 23 and a front edge of the dummy electrode 25 in the front-rear direction), L2 is a shortest distance between the dummy electrode 25 and the edge of the casing 110 in the left-right direction (i.e., a distance between a right edge of the dummy electrode 25 and the right side surface 116 in the left-right direction), and L3 is a shortest distance among distances between edges of the terminals 22 and the edge of the casing 110 in the left-right direction (i.e., a distance between a right edge of the rightmost terminal 22 and the right side surface 116 in the left-right direction).

As described above, in the second embodiment, the dummy electrode 25 is provided on the printed circuit board 21, and the terminals 22 and the dummy electrode 25 are arranged such that the inequity of L1+L2<L3 is met. Hence, even if electrostatic discharge to any of the terminals 22 occurs when the right side surface 116 of the casing 110 having the largest surface area is placed on the reference plane G, the discharge current is highly likely to flow from the terminal 22 to the corresponding through electrode 23, then to the dummy electrode 25 on the lower surface, and finally to the reference plane G sequentially in this order. That is, the discharge current caused by the electrostatic discharge is highly likely to flow into the reference plane G through the dummy electrode 25 that is not electrically connected to the integrated circuit 24b. As a result, the integrated circuit 24b is less likely to be damaged by the discharge current. Further, the dummy electrode 25 is formed on the lower surface of the printed circuit board 21 that is opposite to the upper surface of the printed circuit board 21 on which the plurality of terminals 22 are formed. Hence, dusts or dirt are less likely to adhere to the dummy electrode 25, preventing deterioration in electrostatic resistance.

Third Embodiment

Figure 7:
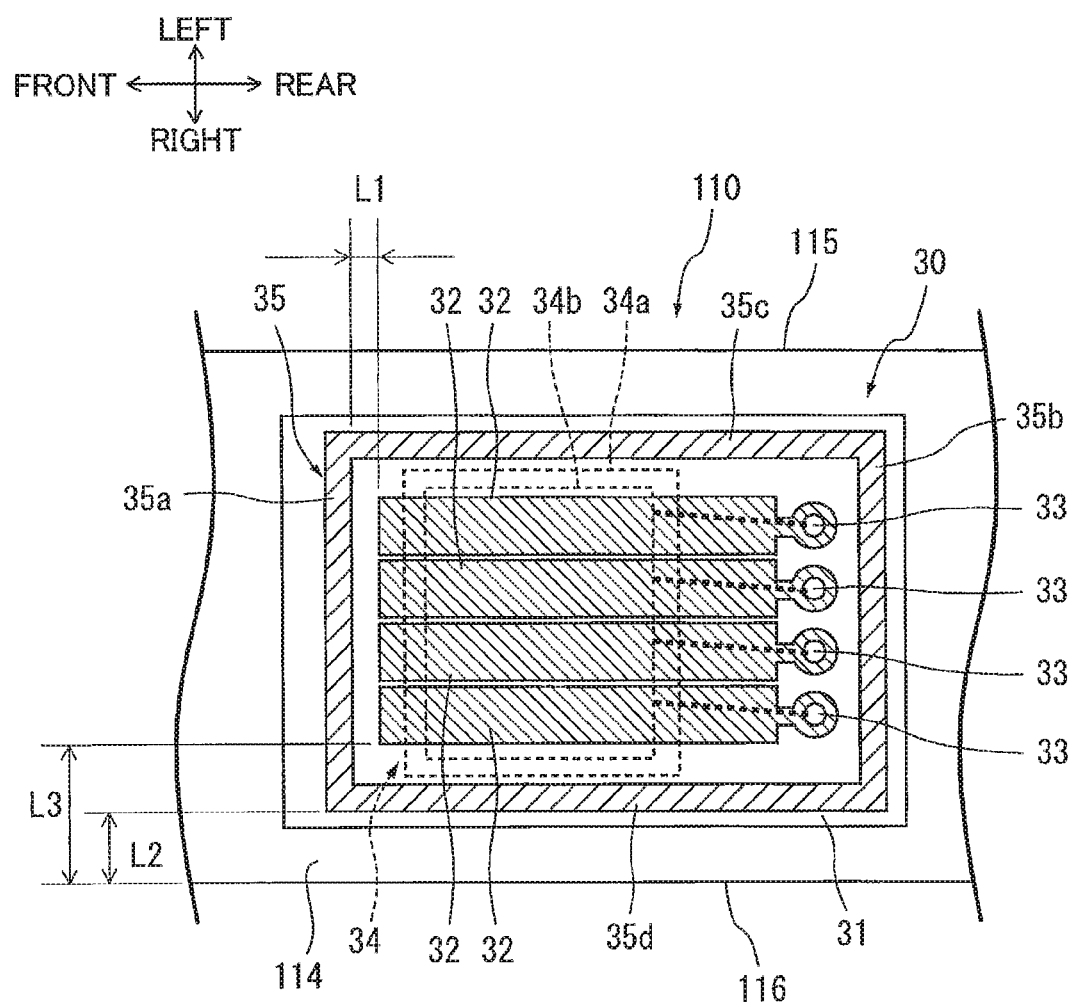
FIG. 7 is a schematic plan view explaining a structure of an IC board mounted on an ink cartridge according to a third embodiment.

An IC board 30 according to a third embodiment of the present disclosure will be described next with reference to FIG. 7. The IC board 30 is arranged on the upper surface 114 of the casing 110, as in the first embodiment.

The IC board 30 includes a printed circuit board 31, four terminals 32, and a chip 34. The terminals 32 are disposed on an upper surface of the printed circuit board 31 to be aligned with one another in the left-right direction of the casing 110. The chip 34 includes a silicone substrate 34a and an integrated circuit 34b mounted on the silicone substrate 34a. The chip 34 is provided on a lower surface of the printed circuit board 31.

The IC board 30 also includes a dummy electrode 35 that is not electrically connected to the integrated circuit 34b. The dummy electrode 35 according to the third embodiment has a generally rectangular annular shape, and is formed on the upper surface of the printed circuit board 31 to enclose the four terminals 32 aligned with one another. Specifically, as illustrated in FIG. 7, the dummy electrode 35 includes extending portions 35a, 35b, 35c and 35d. The extending portions 35a and 35b extend in the left-right direction of the casing 110 (in the direction in which the terminals 32 are aligned with one another). The extending portions 35c and 35d extend parallel to the terminals 32, i.e., are elongated in a direction the same as that in which the terminals 32 extend.

In the third embodiment, the dummy electrode 35 is disposed on the upper surface of the printed circuit board 31 such that L1 represents a shortest distance between front ends of the terminals 32 and the extending portion 35a. Also in the third embodiment, the terminals 32 and the dummy electrode 35 are arranged such that the inequity of L1+L2<L3 is met, where L1 is a shortest distance among distances between edges of the terminals 32 and the dummy electrode 35 (i.e., a distance between a front edge of the leftmost terminal 32 and a rear edge of the extending portion 35a of the dummy electrode 35 in the front-rear direction), L2 is a shortest distance between an edge of the dummy electrode 35 and the edge of the casing 110 in the left-right direction (i.e., a distance between a right edge of the extending portion 35d of the dummy electrode 35 and the right side surface 116 in the left-right direction), and L3 is a shortest distance among distances between edges of the terminals 32 and the edge of the casing 110 in the left-right direction (i.e., a distance between a right edge of the rightmost terminal 32 and the right side surface 116 in the left-right direction).

As described above, in the third embodiment, the dummy electrode 35 is formed on the electrically insulating printed circuit board 31, and the terminals 32 and the dummy electrode 35 are arranged to provide a positional relationship represented by the inequity of L1+L2<L3. Thus, even if electrostatic discharge to any of the terminals 32 occurs when the right side surface 116 of the casing 110 having the largest surface area is placed on the reference plane G, the discharge current is highly likely to flow from the terminal 32 to the dummy electrode 35 (extending part 35a thereof), and finally to the reference plane G. That is, the discharge current is highly likely to flow into the reference plane G through the dummy electrode 35 that is not electrically connected to the integrated circuit 34b. As a result, the integrated circuit 34b is less likely to be damaged by the discharge current caused by the electrostatic discharge.

Fourth Embodiment

Figure 8:
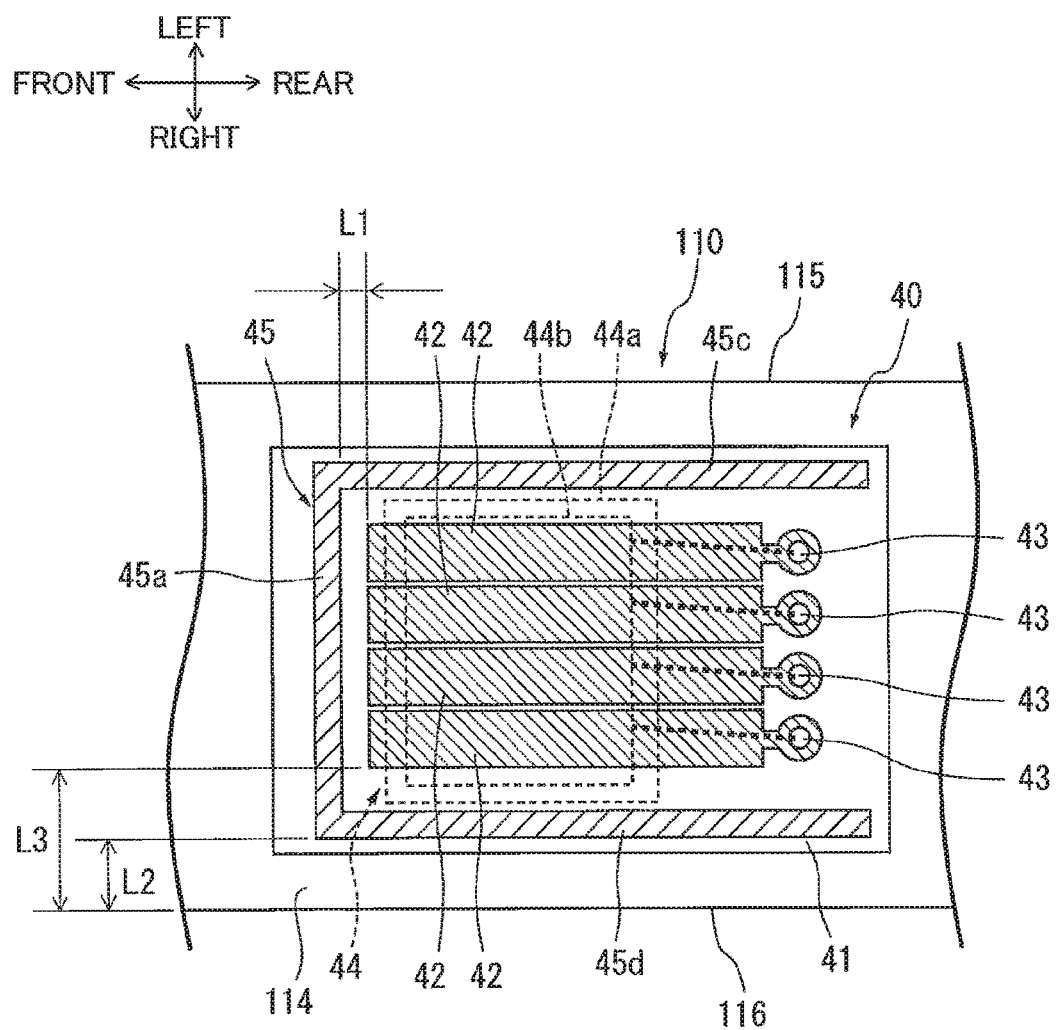
FIG. 8 is a schematic plan view explaining a structure of an IC board mounted on an ink cartridge according to a fourth embodiment.

An IC board 40 according to a fourth embodiment of the present disclosure will be described next with reference to FIG. 8. The IC board 40 is arranged on the upper surface 114 of the casing 110, as in the first embodiment.

The IC board 40 includes a printed circuit board 41, four terminals 42, and a chip 44. The terminals 42 are disposed on an upper surface of the printed circuit board 41 to be aligned with one another in the left-right direction of the casing 110. The chip 44 includes a silicone substrate 44a and an integrated circuit 44b mounted on the silicone substrate 44a. The chip 44 is provided on a lower surface of the printed circuit board 41.

The IC board 40 includes a dummy electrode 45 that is not electrically connected to the integrated circuit 44b. The dummy electrode 45 is generally U-shaped and is formed on the upper surface of the printed circuit board 41 so as to surround three sides of the aligned terminals 42. Specifically, as illustrated in FIG. 8, the dummy electrode 45 includes extending portions 45a, 45c and 45d. The extending portion 45a is elongated in the left-right direction of the casing 110 (in a direction in which the terminals 42 are aligned with one another). The extending portions 45c and 45d extend parallel to the terminals 42, i.e., in a direction in which the terminals 42 extend.

In the fourth embodiment, the dummy electrode 45 is disposed on the upper surface of the printed circuit board 41 such that L1 denotes a shortest distance between front ends of the terminals 42 and the extending portion 45a. Also in the fourth embodiment, the terminals 42 and the dummy electrode 45 are arranged such that the inequity of L1+L2<L3 is met, where L1 is the shortest distance among distances between edges of the terminals 42 and an edge of the dummy electrode 45 in the front-rear direction (i.e., a distance between a front edge of the leftmost terminal 42 and a rear edge of the extending portion 45a of the dummy electrode 45 in the front-rear direction), L2 is a shortest distance between an edge of the dummy electrode 45 and the edge of the casing 110 in the left-right direction (i.e., a distance between a right edge of the extending portion 45d of the dummy electrode 45 and the right side surface 116 in the left-right direction), and L3 is a shortest distance among distances between edges of the terminals 42 and the edge of the casing 110 in the left-right direction (i.e., a distance between a right edge of the rightmost terminal 42 and the right side surface 116 in the left-right direction).

As described above, the IC board 40 of the fourth embodiment includes the dummy electrode 45 formed on the electrically insulating printed circuit board 41, and the terminals 42 and the dummy electrode 45 are arranged to satisfy the relationship of L1+L2<L3. Thus, even if there occurs electrostatic discharge to any of the terminals 42 when the right side surface 116 of the casing 110 having the largest surface area is placed on the reference plane G, the discharge current is highly likely to flow from the terminal 42 to the dummy electrode 45 (extending portion 45a of the dummy electrode 45), and finally to the reference plane G. That is, the discharge current is highly likely to flow into the reference plane G through the dummy electrode 45 that is not electrically connected to the integrated circuit 44b. As a result, the integrated circuit 44b is less likely to be damaged due to the discharge current attributed to the electrostatic discharge.

Fifth Embodiment

Figure 9:
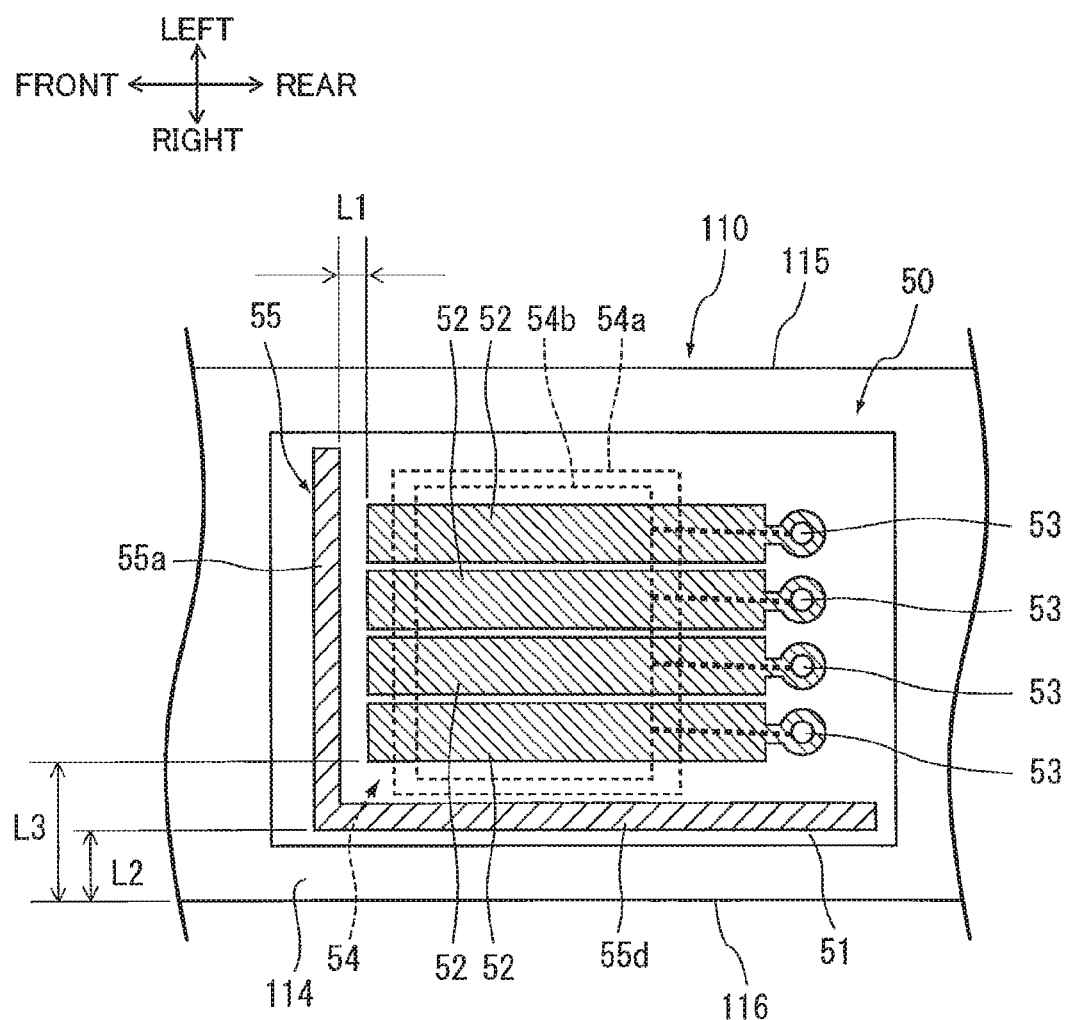
FIG. 9 is a schematic plan view explaining a structure of an IC board mounted on an ink cartridge according to a fifth embodiment.

An IC board 50 according to a fifth embodiment of the present disclosure will be described next with reference to FIG. 9. The IC board 50 is arranged on the upper surface 114 of the casing 110, as in the first embodiment.

The IC board 50 includes a printed circuit board 51, four terminals 52, and a chip 54. The terminals 52 are disposed on an upper surface of the printed circuit board 51 to be aligned with one another in the left-right direction of the casing 110. The chip 54 includes a silicone substrate 54a and an integrated circuit 54b mounted on the silicone substrate 54a. The chip 54 is provided on a lower surface of the printed circuit board 51.

The IC board 50 also includes a dummy electrode 55 that is not electrically connected to the integrated circuit 54b. The dummy electrode 55 is generally L-shaped, and is formed on the upper surface of the printed circuit board 51 to occupy a region forward and rightward of the arrayed terminals 52. More specifically, as illustrated in FIG. 9, the dummy electrode 55 includes extending portions 55a and 55d. The extending portion 55a extends in a direction in which the terminals 52 are aligned with one another (i.e., in the left-right direction of the casing 110). The extending portion 55d extends parallel to the terminals 52, i.e., in a direction in which the terminals 52 extend.

In the fifth embodiment, the dummy electrode 55 is disposed such that L1 is defined as a shortest distance between front ends of the terminals 52 and the extending portion 55a. That is, also in the fifth embodiment, the terminals 52 and the dummy electrode 55 are arranged such that the inequity of L1+L2<L3 is met, where L1 is the shortest distance among distances between edges of the respective terminals 52 and an edge of the dummy electrode 55 in the front-rear direction (i.e., a distance between a front edge of the leftmost terminal 52 and a rear edge of the extending portion 55a of the dummy electrode 55 in the front-rear direction), L2 is a shortest distance between an edge of the dummy electrode 55 and the edge of the casing 110 in the left-right direction (i.e., a distance between a right edge of the extending portion 55d of the dummy electrode 55 and the right side surface 116 in the left-right direction), and L3 is a shortest distance among distances between edges of the terminals 52 and the edge of the casing 110 in the left-right direction (i.e., a distance between a right edge of the rightmost terminal 52 and the right side surface 116 in the left-right direction).

As described above, in the fifth embodiment, the dummy electrode 55 is provided, and the terminals 52 and the dummy electrode 55 are arranged to satisfy the relationship represented by the expression of L1+L2<L3. Thus, even if electrostatic discharge to any of the terminals 52 occurs when the right side surface 116 of the casing 110 having the largest surface area is placed on the reference plane G, the discharge current is highly likely to flow from the terminal 52 to the dummy electrode 55 (extending part 55a of the dummy electrode 55), and finally to the reference plane G. That is, the discharge current caused by the electrostatic discharge is highly likely to flow into the reference plane G through the dummy electrode 55 that is not electrically connected to the integrated circuit 54b. Hence, this configuration of the fifth embodiment can reduce a likelihood that the integrated circuit 54b may be damaged due to the discharge current caused by the electrostatic discharge.

Sixth Embodiment

Figure 10:
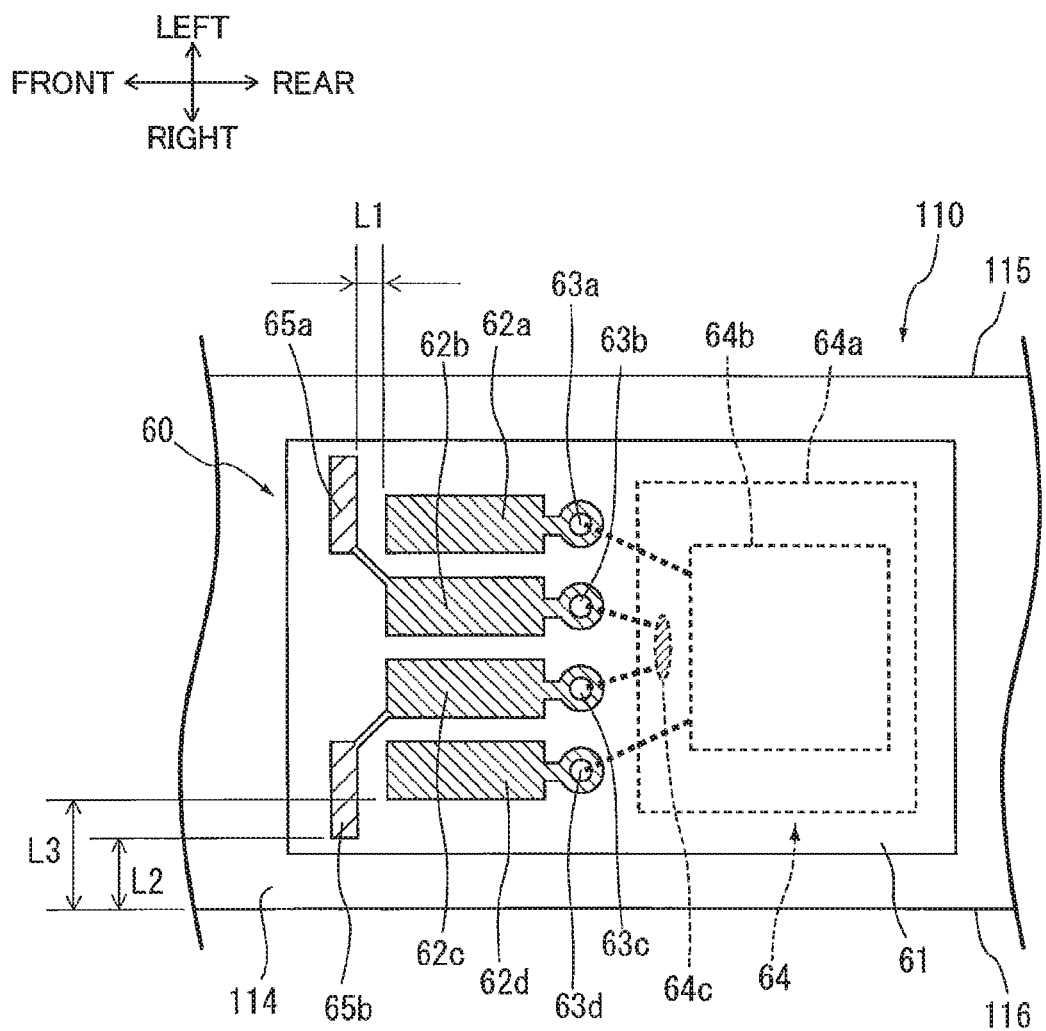
FIG. 10 is a schematic plan view explaining a structure of an IC board mounted on an ink cartridge according to a sixth embodiment.

An IC board 60 according to a sixth embodiment of the present disclosure will be described next with reference to FIG. 10. The IC board 60 is arranged on the upper surface 114 of the casing 110, as in the first embodiment.

The IC board 60 includes a printed circuit board 61, four terminals 62a, 62b, 62c and 62d, and a chip 64. The terminals 62a, 62b, 62c and 62d are disposed on an upper surface of the printed circuit board 61 to be aligned with one another in the left-right direction of the casing 110. The chip 64 includes a silicone substrate 64a and an integrated circuit 64b mounted on the silicone substrate 64a. The chip 64 is disposed on a lower surface of the printed circuit board 61.

The terminals 62a, 62b, 62c and 62d includes through electrodes 63a, 63b, 63c and 63d, respectively. Each of the through electrodes 63a, 63b, 63c and 63d is formed by filling an electrically conductive material in a via hole vertically penetrating the printed circuit board 61. In the example illustrated in FIG. 10, the through electrodes 63a, 63b, 63c and 63d are formed at rear ends of the terminals 62a, 62b, 62c and 62d, respectively. Of the through electrodes 63a, 63b, 63c and 63d of the terminals 62a, 62b, 62c and 62d, the through electrodes 63a and 63d are connected to the integrated circuit 64b through corresponding wirings denoted by thick dashed lines in FIG. 10. The through electrodes 63b and 63c are connected to a pad electrode 64c on the silicone substrate 64a through corresponding wirings denoted by thick dashed lines in FIG. 10. The through electrodes 63b and 63c have the same potential as each other.

The IC board 60 also includes two dummy electrodes 65a and 65b both of which are not electrically connected to the integrated circuit 64b. The dummy electrodes 65a and 65b are formed on the upper surface of the printed circuit board 61. Specifically, the dummy electrode 65a is formed forward of the terminal 62a, and the dummy electrode 65b is formed forward of the terminal 62d. The terminals 62a, 62b, 62c and 62d and the dummy electrodes 65a and 65b are arranged such that the inequity of L1+L2<L3 is met, where L1 is a shortest distance among distances between edges of the terminals 62a, 62b, 62c and 62d and edges of the dummy electrodes 65a and 65b in the front-rear direction (i.e., a distance between a front edge of the terminal 62a and a rear edge of the dummy electrode 65a in the front-rear direction), L2 is a shortest distance among distances between edges of the dummy electrodes 65a and 65b and the edge of the casing 110 in the left-right direction (i.e., a distance between a right edge of the dummy electrode 65b and the right side surface 116 in the left-right direction), and L3 is a shortest distance among distances between edges of the terminals 62a, 62b, 62c and 62d and the edge of the casing 110 in the left-right direction (i.e., a distance between a right edge of the rightmost terminal 62d and the right side surface 116 in the left-right direction).

Further, the dummy electrodes 65a and 65b are connected to the terminals 62b and 62c, respectively. That is, the dummy electrode 65a is connected to the dummy electrode 65b through the terminal 62b, the through electrode 63b, the wiring connecting the through electrode 63b to the pad electrode 64c, the pad electrode 64c, the wiring connecting the pad electrode 64c to the through electrode 63c, the through electrode 63c, and the terminal 62c. In this way, the dummy electrodes 65a and 65b may be electrically connected to each other via the silicone substrate 64a, provided that: the inequity of L1+L2<L3 is met; and neither the dummy electrode 65a nor the dummy electrode 65b is electrically connected to the integrated circuit 64b.

In the sixth embodiment, the dummy electrodes 65a and 65b are formed on the electrically insulating printed circuit board 61, and the terminals 62a, 62b, 62c and 62d and the dummy electrodes 65a and 65b are arranged such that the inequity of L1+L2<L3 is met. Hence, even if current is generated in the terminals 62a due to the electrostatic discharge when the right side surface 116 of the casing 110 having the largest surface area is placed on the reference plane G, the generated current is highly likely to flow, from the terminal 62a, to the dummy electrode 65a, and then sequentially to the terminal 62b, the through electrode 63b, the wiring connecting the through electrode 63b and the pad electrode 64c, the pad electrode 64c, the wiring connecting the pad electrode 64c to the through electrode 63c, the through electrode 63c, the terminal 62c, the dummy electrode 65b, and finally to the reference plane G. That is, the generated current is highly likely to flow to the reference plane G through the dummy electrodes 65a and 65b that are electrically disconnected from (i.e., electrically insulated from) the integrated circuit 64b. As a result, there is a lower possibility that the integrated circuit 64b is damaged due to the current caused by the electrostatic discharge.

Incidentally, in a case where a plurality of dummy electrodes such as the dummy electrodes 65a and 65b are provided as in the sixth embodiment, such dummy electrodes 65a and 65b may be used for detecting information relating to the cartridge (such as whether the cartridge is attached to the cartridge holder) by configuring the dummy electrodes 65a and 65b to be electrically connectable to the electrical contact 3 provided on the cartridge holder 1 of the printer (not illustrated), for example.

Seventh Embodiment

Figure 11:
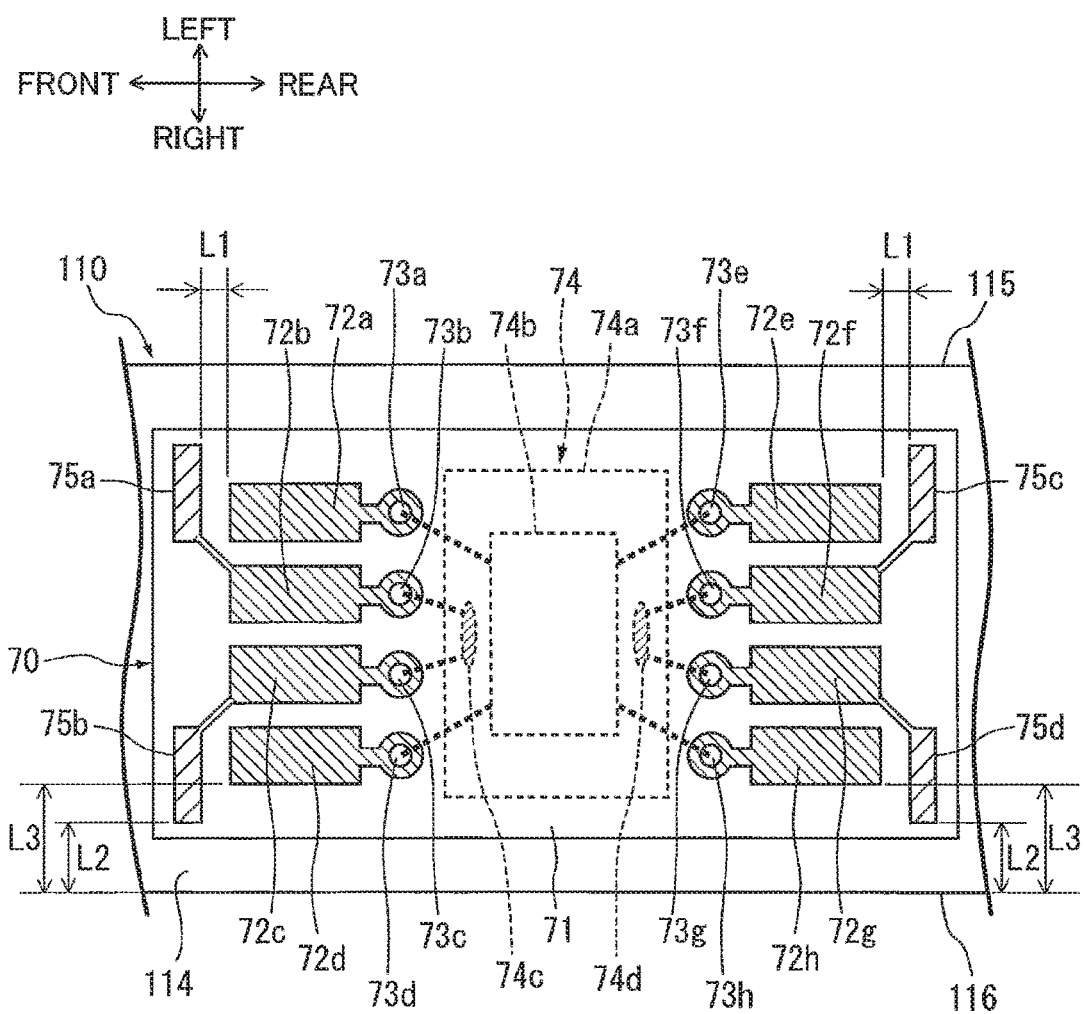
FIG. 11 is a schematic plan view explaining a structure of an IC board mounted on an ink cartridge according to a seventh embodiment.

An IC board 70 according to a seventh embodiment of the present disclosure will be described next with reference to FIG. 11. The IC board 70 is arranged on the upper surface 114 of the casing 110, as in the first embodiment.

The IC board 70 includes a printed circuit board 71, eight terminals 72a, 72b, 72c, 72d, 72e, 72f, 72g and 72h, and a chip 74. The chip 74 includes a silicone substrate 74a and an integrated circuit 74b mounted on the silicone substrate 74a. The chip 74 is disposed on a lower surface of the printed circuit board 71.

The terminals 72a, 72b, 72c, 72d, 72e, 72f, 72g and 72h are disposed on an upper surface of the printed circuit board 71. Specifically, the terminals 72a, 72b, 72c and 72d are aligned with one another in the left-right direction and arranged frontward relative to a center of the printed circuit board 71. The terminals 72e, 72f, 72g and 72h are aligned with one another in the left-right direction and arranged rearward relative to the center of the printed circuit board 71.

The terminals 72a, 72b, 72c, 72d, 72e, 72f, 72g and 72h include through electrodes 73a, 73b, 73c, 73d, 73e, 73f, 73g and 73h, respectively. Each of the through electrodes 73a, 73b, 73c, 73d, 73e, 73f, 73g and 73h is formed by filling an electrically conductive material in a via hole penetrating the printed circuit board 71. Specifically, in the example illustrated in FIG. 11, the through electrodes 73a, 73b, 73c and 73d are formed at rear ends of the terminals 72a, 72b, 72c and 72d, respectively. The through electrodes 73e, 73f, 73g and 73h are formed at front ends of the terminals 72e, 72f, 72g, and 72h, respectively. Of the eight through electrodes 73a to 73h of the eight terminals 72a to 72h, the through electrodes 73a, 73d, 73e, and 73h are connected to the integrated circuit 74b through corresponding wirings denoted by thick dashed lines in FIG. 11. The through electrodes 73b and 73c are both connected to a pad electrode 74c on the silicone substrate 74a through corresponding wirings also denoted by thick dashed lines in FIG. 11. The through electrodes 73b and 73c have the same potential as each other. The through electrodes 73f and 73g are both connected to a pad electrode 74d on the silicone substrate 74a through corresponding wirings denoted by thick dashed lines in FIG. 11. The through electrodes 73f and 73g have the same potential as each other.

The IC board 70 also includes four dummy electrodes 75a, 75b, 75c and 75d that are not electrically connected to the integrated circuit 74b. The dummy electrodes 75a and 75b are formed on the upper surface of the printed circuit board 71 at positions forward of the terminals 72a and 72d, respectively. The terminals 72a, 72b, 72c and 72d and the dummy electrodes 75a and 75b are arranged such that the inequity of L1+L2<L3 is met, where L1 is a shortest distance among distances between edges of the terminals 72a, 72b, 72c and 72d and edges of the dummy electrodes 75a and 75b in the front-rear direction (i.e., a distance between a front edge of the terminal 72a and a rear edge of the dummy electrode 75a in the front-rear direction), L2 is a shortest distance among distances between edges of the dummy electrodes 75a and 75b and the edge of the casing 110 in the left-right direction (i.e., a distance between a right edge of the dummy electrode 75b and the right side surface 116 in the left-right direction), and L3 is a shortest distance among distances between edges of the terminals 72a, 72b, 72c and 72d and the edge of the casing 110 in the left-right direction (i.e., a distance between a right edge of the rightmost terminal 72d and the right side surface 116 in the left-right direction).

Likewise, the dummy electrodes 75c and 75d are formed on the upper surface of the printed circuit board 71 at positions rearward of the terminals 72e and 72h, respectively. The terminals 72e, 72f, 72g, and 72h and the dummy electrodes 75c and 75d are arranged such that the inequity of L1+L2<L3 is met, where L1 is a shortest distance among distances between edges of the terminals 72e, 72f, 72g and 72h and edges of the dummy electrodes 75c and 75d in the front-rear direction (i.e., a distance between a rear edge of the terminal 72e and a front edge of the dummy electrode 75c in the front-rear direction), L2 is a shortest distance among distances between edges of the dummy electrodes 75c and 75d and the edge of the casing 110 in the left-right direction (i.e., a distance between a right edge of the dummy electrode 75d and the right side surface 116 in the left-right direction), and L3 is a shortest distance among distances between edges of the terminals 72e, 72f, 72g and 72h and the edge of the casing 110 in the left-right direction (i.e., a distance between a right edge of the rightmost terminal 72h and the right side surface 116 in the left-right direction).

Further, the dummy electrodes 75a and 75b are connected to the terminals 72b and 72c, respectively. That is, the dummy electrode 75a is electrically connected to the dummy electrode 75b through the terminal 72b, the through electrode 73b, the wiring connecting the through electrode 73b and the pad electrode 74c, the pad electrode 74c, the wiring connecting the pad electrode 74c and the through electrode 73c, the through electrode 73c, and the terminal 72c. Similarly, the dummy electrodes 75c and 75d are connected to the terminals 72f and 72g. That is, the dummy electrode 75c is electrically connected to the dummy electrode 75d through the terminal 72f, the through electrode 73f, the wiring connecting the through electrode 73f and the pad electrode 74d, the pad electrode 74d, the wiring connecting the pad electrode 74d and the through electrode 73g, the through electrode 73g, and the terminal 72g. In this way, the dummy electrodes 75a, 75b, 75c and 75d may be connected to respective counterparts through electrical paths formed on the chip 74 (silicone substrate 74a), provided that: the inequity of L1+L2<L3 is met; and the dummy electrodes 75a, 75b, 75c and 75d are not electrically connected to the integrated circuit 74b.

In the seventh embodiment, the dummy electrodes 75a, 75b, 75c and 75d are formed on the electrically insulating printed circuit board 71, and the terminals 72a to 72h and the dummy electrodes 75a to 75d are arranged such that the inequity of L1+L2<L3 is met. Hence, even if electrostatic discharge occurs to the terminal 72a when the right side surface 116 of the casing 110 having the largest surface area is placed on the reference plane G, the discharge current is highly likely to flow, from the terminal 72a, to the dummy electrode 75a, the terminal 72b, the through electrode 73b, the wiring connecting the through electrode 73b and the pad electrode 74c, the pad electrode 74c, the wiring connecting the pad electrode 74c and the through electrode 73c, the through electrode 73c, the terminal 72c, the dummy electrode 75b, and finally to the reference plane G, sequentially in this order. Similarly, even in a case where electrostatic discharge occurs to the terminal 72e, the discharge current is highly likely to flow, from the terminal 72e, to the dummy electrode 75c, the terminal 72f, the through electrode 73f, the wiring connecting the through electrode 73f and the pad electrode 74d, the pad electrode 74d, the wiring connecting the pad electrode 74d and the through electrode 73g, the through electrode 73g, the terminal 72g, the dummy electrode 75d, and finally to the reference plane G sequentially in this order. That is, the discharge current is highly likely to flow into the reference plane G either through the dummy electrodes 75a and 75b that are not electrically connected to the integrated circuit 74b, or through the dummy electrodes 75c and 75d that are not electrically connected to the integrated circuit 74b. As a result, this structure of the seventh embodiment can lower a possibility that the integrated circuit 74b may be damaged due to the discharge current caused by the electrostatic discharge.

Incidentally, in a case where a plurality of dummy electrodes such as the dummy electrodes 75a to 75h are provided as in the seventh embodiment, such dummy electrodes 75a to 75h may be used to detect information relating to the cartridge (such as whether the cartridge is attached to the cartridge holder) by configuring the dummy electrodes 75a to 75h to be electrically connectable to the electrical contact 3 provided on the cartridge holder 1 of the printer (not illustrated), for example.

Eighth Embodiment

Figure 12A:
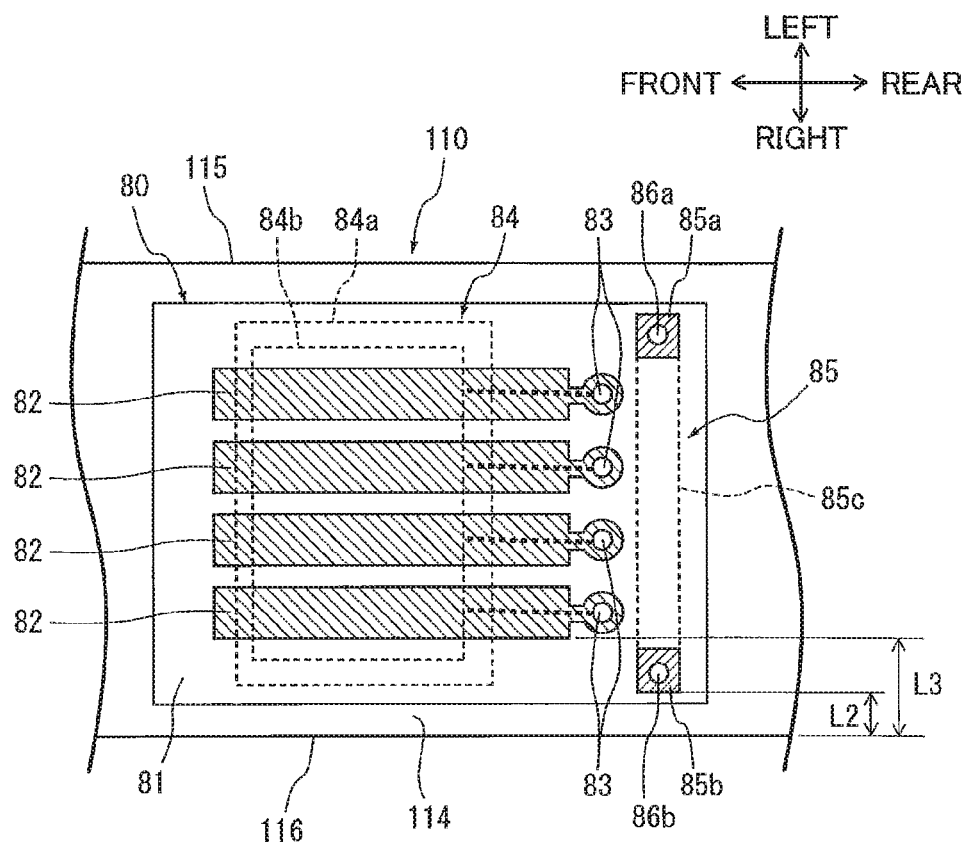
FIG. 12A is a schematic plan view explaining a structure of an upper surface of an IC board mounted on an ink cartridge according to an eighth embodiment.
Figure 12B:
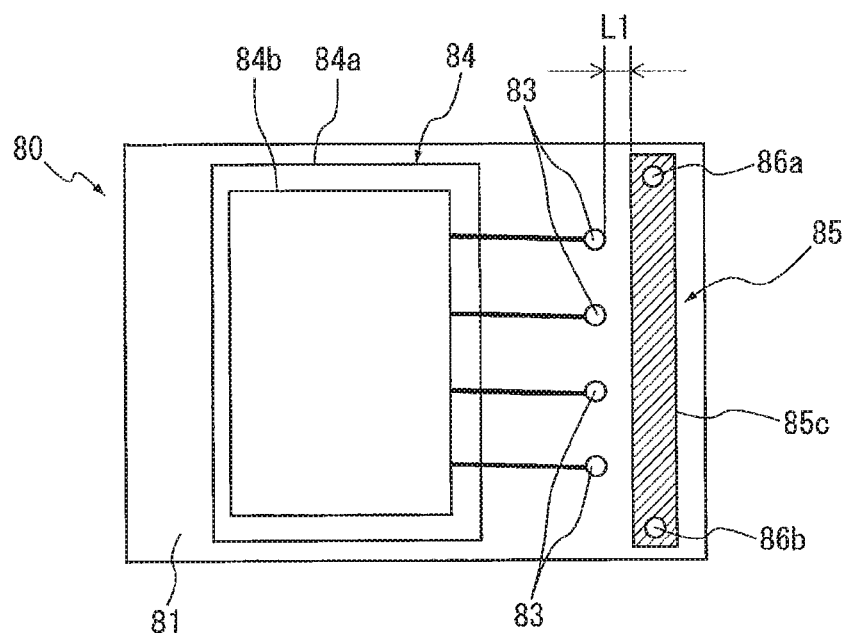
FIG. 12B is a schematic plan view explaining a structure of a lower surface of the IC board mounted on the ink cartridge according to the eighth embodiment.

An IC board 80 according to an eighth embodiment of the present disclosure will be described next with reference to FIGS. 12A and 12B. The IC board 80 is arranged on the upper surface 114 of the casing 110, as in the first embodiment.

Like the IC board 20 according to the second embodiment, the IC board 80 includes a printed circuit board 81, four terminals 82 aligned with one another in the left-right direction, and a chip 84. The terminals 82 are disposed on an upper surface of the printed circuit board 81. The chip 84 is disposed on a lower surface of the printed circuit board 81. The chip 84 includes a silicone substrate 84a and an integrated circuit 84b mounted on the silicone substrate 84a.

The IC board 80 also includes a dummy electrode 85 that is not electrically connected to the integrated circuit 84b. Specifically, the dummy electrode 85 includes a pair of upper-surface electrodes 85a and 85b formed on the upper surface of the printed circuit board 81, a lower-surface electrode 85c formed on the lower surface of the printed circuit board 81, and a pair of through electrodes 86a and 86b. The through electrode 86a connects the upper-surface electrode 85a to the lower-surface electrode 85c, while the through electrode 86b connects the upper-surface electrode 85b to the lower-surface electrode 85c.

The upper-surface electrode 85a is provided at a position rearward of the terminals 82 and near a left edge of the printed circuit board 81 (i.e., the left side surface 115). The upper-surface electrode 85b is provided at a position rearward of the terminals 82 and near the right edge of the printed circuit board 81 (i.e., the right side surface 116). The lower-surface electrode 86 is provided on the lower surface of the printed circuit board 81 at a position rearward relative to the terminals 82 (or rearward of the chip 84). The lower-surface electrode 86 is elongated in the left-right direction. Each of the through electrodes 86a and 86b is formed by filling an electrically conductive material in a via hole penetrating the printed circuit board 81 vertically. The through electrode 87a connects the upper-surface electrode 85a to one end (left end) of the lower-surface electrode 85c, and the through electrode 87b connects the upper-surface electrode 85b and the other end (right end) of the lower-surface electrode 85c.

In the eighth embodiment, the lower-surface electrode 85c of the dummy electrode 85 is arranged such that L1 is defined as a shortest distance among distances between edges of the through electrodes 83 of the terminals 82 and an edge of the lower-surface electrode 85c on the lower surface of the printed circuit board 81 (i.e., a distance between a rear edge of the leftmost through electrode 83 and a front edge of the lower-surface electrode 85c in the front-rear direction). Further, the upper-surface electrode 85b of the dummy electrode 85 is arranged on the upper surface of the printed circuit board 81 such that L2 is defined as a shortest distance between an edge of the upper-surface electrode 85b and the edge of the casing 110 in the left-right direction (i.e., a distance between a right edge of the upper-surface electrode 85b and the right side surface 116 in the left-right direction). That is, also in the eighth embodiment, the terminals 82 and the dummy electrode 85 are arranged to satisfy the inequity of L1+L2<L3, where L1 is the shortest distance among distances between edges of the terminals 82 and an edge of the dummy electrode 85 in the front-rear direction (i.e., a distance between a rear edge of the through electrode 83 of the leftmost terminal 82 and a front edge of the lower-surface electrode 85c of the dummy electrode 85 in the front-rear direction), L2 is the shortest distance between an edge of the dummy electrode 85 and the edge of the casing 110 in the left-right direction (i.e., a distance between a right edge of the upper-surface electrode 85b and the right side surface 116 in the left-right direction), and L3 is a shortest distance among distances between edges of the terminals 82 and the edge of the casing 110 in the left-right direction (i.e., a distance between a right edge of the rightmost terminal 82 and the right side surface 116 in the left-right direction).

As described above, in the eighth embodiment, the dummy electrode 85 is formed on the electrically insulating printed circuit board 81, and the terminals 82 and the dummy electrode 85 are arranged such that the inequity of L1+L2<L3 is met. Accordingly, even if electrostatic discharge occurs to any of the terminals 82 when the right side surface 116 of the casing 110 having the largest surface area is placed on the reference plane G, the discharge current is highly likely to flow, from the terminal 82, to the corresponding through electrode 83, the dummy electrode 85c, the through electrode 86b, the upper-surface electrode 85b, and finally to the reference plane G sequentially in this order. That is, the discharge current is highly likely to flow into the reference plane G through the dummy electrode 85 that is not electrically connected to the integrated circuit 84b. As a result, this structure of the eighth embodiment can suppress occurrence of damage to the integrated circuit 84b due to the discharge current resulting from by electrostatic discharge.

Ninth Embodiment

In the first to eighth embodiments described above, the present disclose is applied to an ink cartridge using the ink cartridge 100 as an illustrative example. However, the present disclosure need not be applied to the ink cartridge but may also be applied to a memory card.

Figure 13:
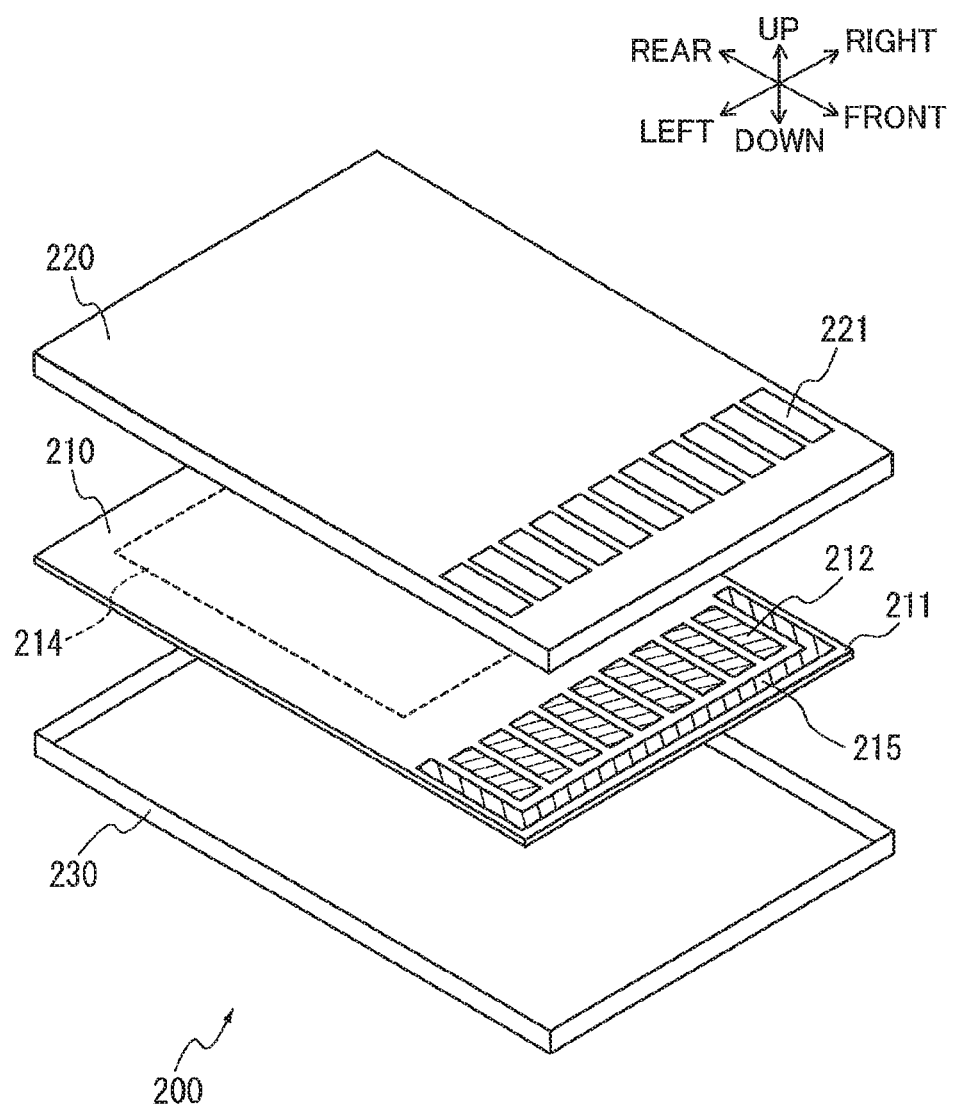
FIG. 13 is an exploded perspective view illustrating a general configuration of a memory card according to a ninth embodiment.
Figure 14:
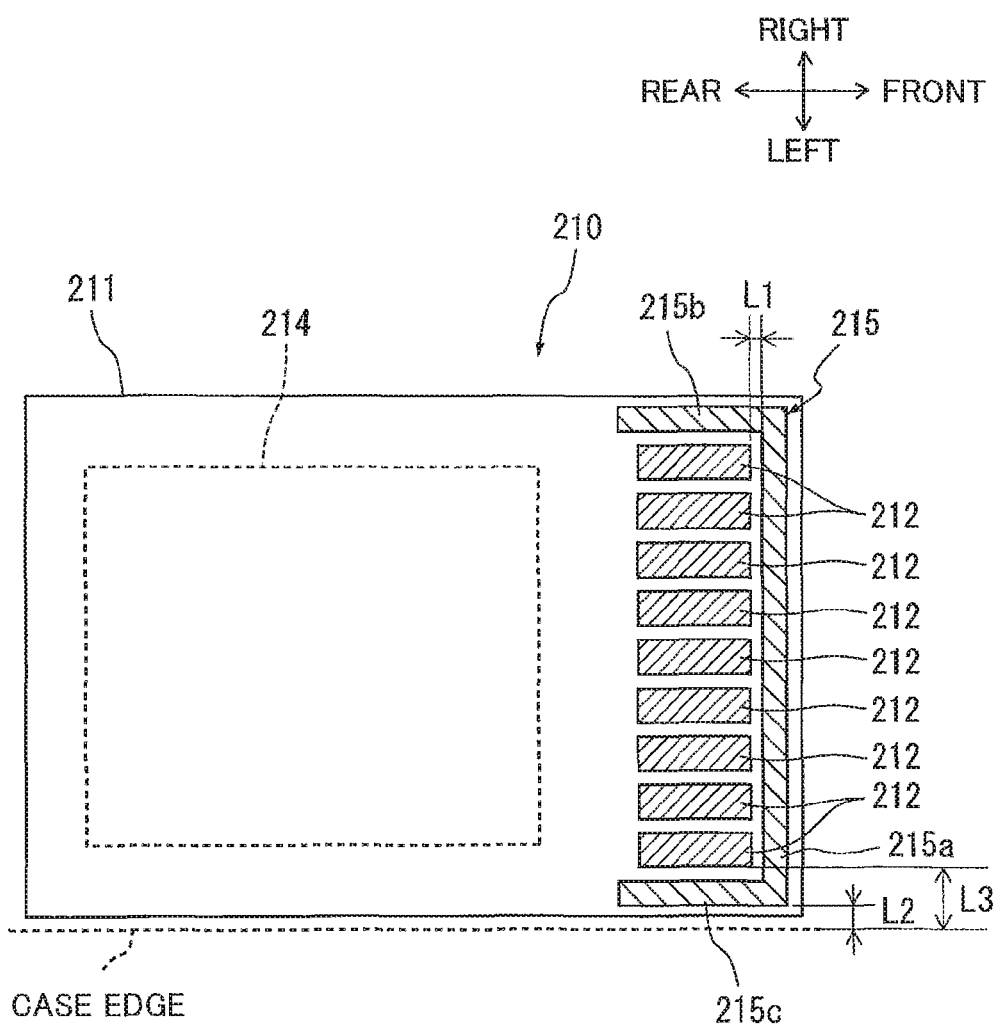
FIG. 14 is a schematic plan view explaining a structure of an IC board of the memory card according to the ninth embodiment.

Hereinafter, a memory card 200 according to a ninth embodiment of the present disclosure will be described with reference to FIGS. 13 and 14.

The memory card 200 is a storage device such as an SD (Secure Digital) card, a micro SD card, or a compact flash (registered trademark). The memory card 200 includes an IC board 210, an upper case 220 and a lower case 230. The upper case 220 and lower case 230 constitute an outer shell of the memory card 200. The IC board 210 is accommodated in the upper case 220 and lower case 230.

Hereinafter, directions in relation to the memory card 200 will be referred to based on a state of the memory card 200 depicted in FIG. 13. That is, the terms "above", "below", "right", "left", "front" and "rear" in relation to the memory card 200 will be used in the following description based on the directions shown in FIG. 13.

The IC board 210 includes a printed circuit board 211, terminals 212, an integrated circuit 214, and a dummy electrode 215. The printed circuit board 211 is a rectangular-shaped board having an electrically insulating property. The terminals 212 and the dummy electrode 215 are formed on an upper surface of the printed circuit board 211. The integrated circuit 214 is mounted on a lower surface of the printed circuit board 211.

The terminals 212 are electrodes for activating the integrated circuit 214. Each of the terminals 212 is elongated in the front-rear direction of the printed circuit board 211. In the ninth embodiment, nine terminals 212 are aligned with one another in the left-right direction of the printed circuit board 211. The terminals 212 include an electrode for data use, an electrode for power supply, and an electrode for clocking, for example.

The integrated circuit 214 is mounted on the lower surface of the printed circuit board 211. Each of the terminals 212 is connected to the integrated circuit 214 through a via hole (not illustrated) formed in the printed circuit board 211. The integrated circuit 214 includes a storage element (not illustrated), such as a DRAM, a SRAM or a flash memory, for example, for storing information that are inputted and outputted through the terminals 212.

The dummy electrode 215 is electrically disconnected from the integrated circuit 214. The dummy electrode 215 of the ninth embodiment is generally U-shaped and is formed on the upper surface of the printed circuit board 211 to surround three sides of a region at which the nine terminals 212 are arranged to be aligned with one another. Specifically, referring to FIG. 14, the dummy electrode 215 includes extending portions 215a, 215b and 215c. The extending portion 215a extends in the left-right direction, that is, in a direction in which the terminals 212 are aligned with one another. The extending portions 215b and 215c extend parallel to the terminals 212, i.e., in a direction in which the terminals 212 extend.

The upper case 220 is a member for covering the IC board 210 from above. The upper case 220 has an upper surface in which a plurality of openings 221 is formed to expose the respective terminals 212. Part of the dummy electrode 215 is also exposed to the outside of the memory card 200 through these openings 221. The lower case 230 has a shallow box-like shape. The IC board 210 is accommodated in the lower case 230. That is, the IC board 210 is disposed between the upper case 220 and lower case 230 in the memory card 200.

In the ninth embodiment as well, the dummy electrode 215 is formed on the electrically insulating printed circuit board 211 and, the terminals 212 and the dummy electrode 215 are arranged such that the inequity of L1+L2<L3 is met, where L1 is a shortest distance among distances between edges of the terminals 212 and an edge of the dummy electrode 215 (i.e., a distance between a front edge of the rightmost terminal 212 and a rear edge of the extending portion 215a of the dummy electrode 215 in the front-rear direction), L2 is a shortest distance between an edge of the dummy electrode 215 and an edge of the case (220 and 230) in the left-right direction (i.e., a distance between a left edge of the extending portion 215c of the dummy electrode 215 and a left edge of the case in the left-right direction), and L3 is the shortest distance among distances between edges of the terminals 212 and the edge of the case in the left-right direction (i.e., a distance between a left edge of the leftmost terminal 212 and the left edge of the case in the left-right direction).

With this structure, as in the first to eighth embodiments, even if there occurs electrostatic discharge to any of the terminals 212 when the lower surface of the memory card 200 is placed on the reference plane G, the discharge current is highly likely to flow from the terminal 212 to the dummy electrode 215, and finally to the reference plane G. That is, the discharge current is highly likely to flow into the reference plane G through the dummy electrode 215 that is not electrically connected to the integrated circuit 214. As a result, there is less likelihood that the integrated circuit 214 may be damaged due to the discharge current caused by the electrostatic discharge.

In the ninth embodiment, the IC board 210 is accommodated in the upper case 220 and lower case 230. However, the IC board 210 need not be housed in a casing. For example, the present disclosure may be applied to a circuit board that is not accommodated in a casing, such as a SIM (Subscriber Identity Module) card, for example.

While the description has been made in detail with reference to the embodiments thereof, it would be apparent to those skilled in the art that many modifications and variations may be made therein without departing from the scope of the disclosure.

REMARKS

The IC boards 10, 20, 30, 40, 50, 60, 70, 80 and 210 are an example of a circuit board. The printed circuit boards 11, 21, 31, 41, 51, 61, 71, 81 and 211 are an example of a substrate. The terminals 12, 22, 32, 42, 52, 62a-62d, 72a-h, 82 and 212 are an example of terminals. The integrated circuits 14b, 24b, 34b, 44b, 54b, 64b, 74b, 84b and 214 are an example of an integrated circuit. The dummy electrodes 15, 25, 35, 45 55, 65a-b, 75a-d, 85 and 215 are an example of a dummy electrode. The through electrodes 13, 23, 33, 43, 53, 63a-d, 73a-h and 83 are an example of an electrical conductor. The upper-surface electrodes 85a and 85b are an example of a first dummy electrode. The lower-surface electrode 85c is an example of a second dummy electrode. The extending portion 45a of the dummy electrode 45 and the extending portion 55a of the dummy electrode 55 are an example of a first portion. The extending portion 45d of the dummy electrode 45 is an example of a second portion. The dummy electrodes 65b, 75b and 75d are an example of another dummy electrode, when the dummy electrodes 65a, 75a and 75c are the example of the dummy electrode. The chips 64 and 74 are an example of a chip. The pad electrodes 64c, 74c and 74d are respectively an example of an electrical conductor. The ink cartridge 100 is an example of a cartridge and an example of a liquid cartridge. The casing 110 is an example of a casing. The right side surface 116 is an example of a first surface of the casing. The upper surface 114 is an example of a second surface of the casing. The cartridge holder 1 is an example of a cartridge holder. The electrical contact 3 is an example of a holder electrode. The memory card 200 is an example of a storage device. The upper case 220 and lower case 230 are an example of a case.

The extending portion 215a is another example of the first portion. The extending portions 215b and 215c are another example of the second portion.

What is claimed is:

1. A circuit board to be mounted on a casing of a cartridge, the circuit board comprising:
    an insulating substrate;
    a plurality of terminals formed on the substrate and exposed to an outside of the casing, the plurality of terminals being aligned with one another in a predetermined direction;
    an integrated circuit mounted on the substrate and electrically connected to the plurality of terminals; and
    a dummy electrode formed on the substrate and electrically disconnected from the integrated circuit;
    wherein an inequity of L1+L2<L3 is met in which:
    L1 is a shortest distance among distances between edges of the plurality of terminals and an edge of the dummy electrode in a direction perpendicular to the predetermined direction;
    L2 is a shortest distance between an edge of the dummy electrode and an edge of the casing in the predetermined direction; and
    L3 is a shortest distance among distances between edges of the plurality of terminals and the edge of the casing in the predetermined direction.

2. The circuit board according to claim 1, wherein the dummy electrode and the plurality of terminals are formed on one surface of the substrate.

3. The circuit board according to claim 1, wherein the substrate has one surface and another surface opposite to the one surface, the plurality of terminals being formed on the one surface, the dummy electrode being formed on the another surface.

4. The circuit board according to claim 3, wherein the substrate is formed with a plurality of via hole in one-to-one correspondence with the plurality of terminals;
    wherein each of the plurality of terminals includes an electrical conductor filled in one of the via holes, the inequity of L1+L2<L3 being met in which L1 is defined as a shortest distance among distances between edges of the electrical conductors and the edge of the dummy electrode in the direction perpendicular to the predetermined direction.

5. The circuit board according to claim 1, wherein the substrate has one surface and another surface opposite to the one surface, the plurality of terminals being formed on the one surface,
    wherein the dummy electrode comprises a first dummy electrode and a second dummy electrode electrically connected to each other, the first dummy electrode being formed on the one surface, and the second dummy electrode being formed on the another surface.

6. The circuit board according to claim 1, wherein the dummy electrode is elongated in the predetermined direction.

7. The circuit board according to claim 1, wherein the dummy electrode is formed to enclose the plurality of terminals.

8. The circuit board according to claim 1, wherein the dummy electrode comprises:
    a first portion extending in the predetermined direction; and
    a second portion extending from the first portion in the direction perpendicular to the predetermined direction, each of the plurality of terminals extending parallel to the second portion,
    wherein the inequity of L1+L2<L3 is met in which L2 is defined as a shortest distance between an edge of the second portion of the dummy electrode and the edge of the casing in the predetermined direction.

9. The circuit board according to claim 1, further comprising:
    another dummy electrode formed on the substrate and aligned with the dummy electrode in the predetermined direction; and
    a chip mounted on the substrate, the chip including the integrated circuit and an electrical conductor electrically disconnected from the integrated circuit, the dummy electrode and the another dummy electrode being electrically connected to each other via the electrical conductor of the chip.

10. A liquid cartridge comprising:
    the circuit board according to claim 1; and
    the casing on which the circuit board is mounted, the casing defining a liquid storage chamber therein for storing liquid, the casing including a liquid outlet port configured to supply the liquid stored in the liquid storage chamber to an outside of the casing.

11. The liquid cartridge according to claim 10, wherein the casing has:
    a first surface having a surface area larger than any other surface constituting the casing; and
    a second surface crossing the first surface, the circuit board being positioned on the second surface;
    wherein, when the casing is placed on a reference plane with the first surface faces vertically downward and in contact with the reference plane, the inequity of L1+L2<L3 is met in which:
    L1 is the shortest distance among distances between the edges of the plurality of terminals and the edge of the dummy electrode in the direction perpendicular to the predetermined direction;
    L2 is a shortest distance between the edge of the dummy electrode and the reference plane in the predetermined direction; and
    L3 is a shortest distance among distances between the edges of the plurality of terminals and the reference plane in the predetermined direction.

12. The liquid cartridge according to claim 10, the liquid cartridge being attachable to a cartridge holder provided with a holder electrode,
    wherein the dummy electrode is configured to be connected to the holder electrode to detect information on the liquid cartridge.

13. The liquid cartridge according to claim 12, wherein the information is indicative of whether or not the liquid cartridge is attached to the cartridge holder.

14. The liquid cartridge according to claim 10, wherein the edge of the dummy electrode in the predetermined direction opposes the reference plane with an air space intervened therebetween in the predetermined direction.

15. A storage device comprising
    a circuit board comprising:
        an insulating substrate;
        a plurality of terminals formed on the substrate, the plurality of terminals being aligned with one another in a predetermined direction;
        an integrated circuit mounted on the substrate and electrically connected to the plurality of terminals; and
        a dummy electrode formed on the substrate and electrically disconnected from the integrated circuit; and a case defining an accommodating space therein for accommodating the circuit board, the case being formed with at least one opening through which the plurality of terminals of the circuit board is exposed to an outside of the case, wherein an inequity of L1+L2<L3 is met in which:

L1 is a shortest distance among distances between edges of the plurality of terminals and an edge of the dummy electrode in a direction perpendicular to the predetermined direction;

L2 is a shortest distance between an edge of the dummy electrode and an edge of the case in the predetermined direction; and L3 is a shortest distance among distances between edges of the plurality of terminals and the edge of the case in the predetermined direction.

16. The storage device according to claim 15, wherein the dummy electrode and the plurality of terminals are formed on one surface of the substrate.

17. The storage device according to claim 15, wherein the dummy electrode comprises:

a first portion extending in the predetermined direction; and a second portion extending from the first portion in the direction perpendicular to the predetermined direction, each of the plurality of terminals extending parallel to the second portion, wherein the inequity of L1+L2<L3 is met in which L2 is defined as a shortest distance between an edge of the second portion of the dummy electrode and the edge of the case in the predetermined direction.

* * * * *